United States Patent
Yam et al.

(10) Patent No.: US 10,424,743 B2
(45) Date of Patent: Sep. 24, 2019

(54) SOLUTION-PROCESSABLE DONOR-ACCEPTOR COMPOUNDS CONTAINING BORON(III) MOIETIES FOR THE FABRICATION OF OPTICAL REFLECTORS AND ORGANIC MEMORY DEVICES AND THEIR PREPARATION THEREOF

(71) Applicant: THE UNIVERSITY OF HONG KONG, Hong Kong (HK)

(72) Inventors: Vivian Wing-Wah Yam, Hong Kong (HK); Chun-Ting Poon, Hong Kong (HK); Di Wu, Hong Kong (HK)

(73) Assignee: THE UNIVERSITY OF HONG KONG, Hong Kong (HK)

( * ) Notice: Subject to any disclaimer, the term of this patent is extended or adjusted under 35 U.S.C. 154(b) by 81 days.

(21) Appl. No.: 15/131,229

(22) Filed: Apr. 18, 2016

(65) Prior Publication Data

US 2016/0343943 A1   Nov. 24, 2016

Related U.S. Application Data

(60) Provisional application No. 62/164,742, filed on May 21, 2015.

(51) Int. Cl.
| | | |
|---|---|---|
| *H01L 51/00* | (2006.01) | |
| *G02B 5/08* | (2006.01) | |
| *H01L 51/05* | (2006.01) | |

(52) U.S. Cl.
CPC .......... *H01L 51/008* (2013.01); *G02B 5/0808* (2013.01); *H01L 51/0003* (2013.01); *H01L 51/0591* (2013.01)

(58) Field of Classification Search
None
See application file for complete search history.

(56) References Cited

U.S. PATENT DOCUMENTS

| | | | |
|---|---|---|---|
| 4,123,268 A | 10/1978 | Halm | |
| 4,394,428 A | 7/1983 | Van Allan et al. | |
| 7,179,534 B2 | 2/2007 | Forrest et al. | |
| 7,986,090 B2 * | 7/2011 | Pfeiffer | H01L 51/5016 313/504 |
| 8,394,666 B2 | 3/2013 | Joo et al. | |
| 8,617,777 B2 | 12/2013 | Tanaka | |
| 2004/0065867 A1 | 4/2004 | Hartmann et al. | |
| 2004/0149552 A1 | 8/2004 | Moeller et al. | |
| 2005/0195640 A1 | 9/2005 | Smith et al. | |
| 2006/0003257 A1 | 1/2006 | Li et al. | |

FOREIGN PATENT DOCUMENTS

| | | | |
|---|---|---|---|
| CN | 1142107 | 2/1997 | |
| CN | 102993223 | 3/2013 | |
| WO | WO-2014090394 A1 * | 6/2014 | ......... H01L 51/0013 |

OTHER PUBLICATIONS

Tanaka et al. Facile Modulation of Optical Properties of Diketonate Containing Polymers by Regulating Complexation Ratios with Boron. Macromolecules 2013, 2969-2975 (Year: 2013).*
Qian et al. Luminescent organogels based on triphenylamine functionalized B-diketones and their difluoroboron complexes. Org Biomol Chem, 13, 2986 (Year: 2015).*
Moerner, et al. "Polymeric Photorefractive Materials", Chemical Reviews, 1994, vol. 94, pp. 127-155.
Yu, et al. "Multifunctional Polymers Exhibiting Photorefractive Effects", Acc. Chem. Res., 1996, vol. 29, pp. 13-21.
International Search Report and Written Opinion for International Application No. PCT/CN2016/082478 dated Aug. 24, 2016, 14 pgs.
Poon, et al. "Synthesis, Photochromic, and Computational Studies of Dithienylethene-Containing β-Diketonate Derivatives and Their Near-Infrared Photochromic Behavior Upon Coordination of a Boron(III) Center", A European Journal Dec. 31, 2013, No. 19, pp. 3467-3476.
Poon, et al. "Boron(III)-Containing Donor—Acceptor Compound with Goldlike Reflective Behavior for Organic Resistive Memory Devices", Angew. Chem. Feb. 15, 2016, vol. 128, pp. 3711-3715.

* cited by examiner

*Primary Examiner* — Tanisha Diggs
(74) *Attorney, Agent, or Firm* — Amin, Turocy & Watson LLP

(57) ABSTRACT

A solution-processable material for the fabrication of optical reflector and organic memory device is disclosed having a donor-acceptor system consisting of a boron(III) moiety as the electron acceptor unit. More specifically, described herein is the utilization of boron(III)-containing donor-acceptor compounds having a chemical structure represented by the following general formula (I) as active material for the fabrication of optical reflectors and organic memory devices.

(I)

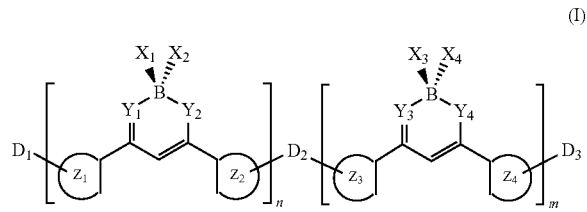

wherein B is a boron atom; each boron atom can attach optionally one or two of the $X_1$, $X_2$, $X_3$ and $X_4$ and two of the $Y_1$, $Y_2$, $Y_3$, and $Y_4$; $X_1$, $X_2$, $X_3$ and $X_4$ are independently a heteroatom or carbon atom, where the heteroatom or group can be F, Cl, Br, I, or OR, and R is a substituent on specific heteroatom or carbon atom which can be selected from alkyl or aromatic groups; $Y_1$, $Y_2$, $Y_3$, and $Y_4$ are independently a heteroatom, where the heteroatom or group can either be O, S, Se, Ge, Te, PR, or NR, and R is a substituent on specific heteroatom or carbon atom which can be selected from alkyl or aromatic groups; $Z_1$, $Z_2$, $Z_3$, and $Z_4$ are cyclic structure derivatives; $D_1$, $D_2$ and $D_3$ are optionally alkyl substituted aromatic groups; and n and m can optionally be any integer.

12 Claims, 9 Drawing Sheets

SOLUTION-PROCESSABLE DONOR-ACCEPTOR COMPOUNDS CONTAINING BORON(III) MOIETIES FOR THE FABRICATION OF OPTICAL REFLECTORS AND ORGANIC MEMORY DEVICES AND THEIR PREPARATION THEREOF

CROSS REFERENCE TO RELATED APPLICATIONS

This application claims priority to provisional application Ser. No. 62/164,742, filed on May 21, 2015, which is incorporated herein by reference.

TECHNICAL FIELD

Described herein is the utilization of solution-processable donor-acceptor compounds containing boron(III) moieties as electron acceptor units for the fabrication of optical reflectors and/or organic memory devices.

BACKGROUND

Push-pull chromophores have attracted enormous interests in the scientific community because of their interesting photophysical, photosensitizing and non-linear optical properties [Kanis et al., *Chem. Rev.* 1994, 94, 195; Long et al., *Angew. Chem., Int. Ed. Engl.* 1995, 34, 21]. In recent decades, this kind of compounds has drawn a lot of attention in material science due to their capability to function as photosensitizers and optoelectronic materials with facile modification of the HOMO and LUMO energy levels and tunable self-assembly morphology. A typical organic push-pull chromophore consists of an electron donor and an electron acceptor connected by a π-conjugated spacer [Grimsdale et al., *Chem. Rev.* 2009, 109, 897; Liang et al., *Chem. Soc. Rev.* 2013, 42, 3453]. The HOMO mainly lies on the electron donor moiety, while the electron acceptor moiety contributes to the LUMO. By the judicious design and suitable choice of the donor and acceptor pair, desirable photophysical and chemical properties can be achieved and widely applied in organic photovoltaics (OPVs) and organic light-emitting diodes (OLEDs). For OPVs, strong electron acceptors have been employed to lower the LUMO level, while moderate strengths of electron donors have been selected to adjust the HOMO level. Also, the electronic absorption profile could be tuned by the selection of donor-acceptor strengths so that the materials could have a better coverage for the absorption of the solar spectrum [Cheng et al., *Chem. Rev.* 2009, 109, 5868; Kippelen et al., *Energy Environ. Sci.,* 2009, 2, 251; Liang et al., *Acc. Chem. Res.* 2010, 43, 1227; Li et al., *Nat. Photonics* 2012, 6, 153; Chen et al., *Acc. Chem. Res.* 2013, 46, 2645]. On the other hand, in order to develop OLED materials with desirable emission colors, with clever selection of the donor-acceptor couple, unnecessary optimization by trial-and-error and tedious synthesis could be avoided [Wang et al., *Chem. Soc. Rev.* 2010, 39, 2387; Uoyama et al., *Nature,* 2012, 492, 234; Li et al., *Chem. Soc. Rev.* 2013, 42, 8416; Xu et al., *Chem Soc. Rev.* 2014, 43, 3259].

To date, new functional materials with main group elements have drawn much attention in the past decade [Hissler et al., *Coord. Chem. Rev.* 2003, 244, 1], especially those main group compounds incorporated with π-conjugated framework. Among those main group elements, group 13 boron has received immense attention due to three major characteristic features. The first one is the fact that boron can form three or four covalent bonds, adopting trigonal planar or tetrahedral geometry, respectively. This geometrical feature may be used as a building block for constructing complex molecules. Secondly, three-coordinated boron(III) compounds consist of a vacant p-orbital, which can form $p_\pi$-$\pi^*$ conjugation effectively when connected to the π-conjugated system [Entwistle et al., *Angew. Chem. Int. Ed.* 2002, 41, 2927; Hudson et al., *Acc. Chem. Res.* 2009, 42, 1584; Jäkle, F. *Chem. Rev.* 2010, 110, 3985]. The electronic and photophysical properties can then be facilely tuned by the π-conjugated system. Thirdly, three-coordinated boron is well-known as a quintessential Lewis acid. The empty $p_\pi$-orbital of the boron center can readily form unique complexes with Lewis bases by nucleophilic attack [Jäkle, F. *Coord. Chem. Rev.* 2006, 250, 1107; Hudnall et al., *Acc. Chem. Res.* 2009, 42, 388; Wase et al., *Chem. Rev.* 2010, 110, 3958]. Moreover, the intrinsic electron-withdrawing ability of boron(III) can induce excited state anisotropism. By exploiting these features, researchers have applied boron-containing compounds to various applications. Despite the multi-functionality of boron(III) atom, this class of compounds has been less explored in different π-conjugated systems because of the dominating and extensive studies on the family of boron dipyrromethenes (BODIPY) [Loudet et al., *Chem. Rev.* 2007, 107, 4891; Kamkaew et al., *Chem. Soc. Rev.* 2013, 42, 77; Bessette et al., *Chem. Soc. Rev.* 2014, 43, 3342] and boron subphthalocyanines (SubPc) [Claessens et al., *Chem. Rev.* 2002, 102, 835; Heremans et al., *Acc. Chem. Res.* 2009, 42, 1740; Bottari et al., *Chem. Rev.* 2010, 110, 6768; Claessens, C. G.; Gonzalez-Rodriguez et al., *Chem. Rev.* 2014, 114, 2192]. Besides these two classes of boron(III) compounds, it is envisaged that the utilization of the intrinsic electron-withdrawing properties of the boron(III) atom in donor-acceptor systems with precise molecular engineering would readily give rise to interesting materials for various applications.

Donor-acceptor systems have been scarcely reported to exhibit gold-like metallic lusters in their crystals [Anex et al., *Chem. Phys.* 1976, 12, 89; Li et al., *J. Am. Chem. Soc.* 1998, 120, 2206; Parakka et al., *Synth. Met.* 1995, 68, 275; Ogura et al., *Org. Biomol. Chem.* 2003, 1, 3845; Evans et al., *Org. Biomol. Chem.* 2013, 11, 3871]. There is still no precise conclusion on the origin of the metallic luster behavior in organic compounds. However, it has been proposed that such highly reflective crystals are originated from the presence of both donor-acceptor systems and strong π-π stacking character. By utilizing the metallic luster of these organic compounds, it is believed that a new class of optical reflectors can be achieved. Besides metallic mirrors, Bragg reflectors (dielectric mirrors) and photonic crystals for use as optical reflectors or filters have been studied extensively. However, Bragg reflectors require multi-layer preparation, where the layers are composed of materials of different refractive indices [Holtz et al., *Nature* 1997, 389, 829; Fink et al., *Science,* 1998, 282, 1679; Weber et al., *Science* 2000, 287, 2451; Yetisen et al., *Chem. Rev.* 2014, 114, 10654], while 3D architecture is essential for optical reflectors based on photonic crystals [Edrington et al., *Adv. Mater* 2001, 13, 421; Ge, J.; Yin, Y., *Angew. Chem. Int. Ed.* 2011, 50, 1492; Gonzalez-Urbina et al., *Chem. Rev.* 2012, 112, 2268; Freymann et al., *Chem. Soc. Rev.* 2013, 42, 2528]. Unlike them, only spin-coating or vacuum deposition is required for optical reflectors that are composed of organic compounds with metallic luster behavior.

On the other hand, electroactive organic materials have been suggested as good alternatives of traditional Si, Ge and GaAs semiconductors that have to face the problem of scaling-down in cell size [Raymo, F. M. *Adv. Mater* 2002, 14, 401]. In contrast to memory devices based on the traditional inorganic semiconductors, organic compounds have the advantages of being capable of fabricating devices that are low cost, large scalability and data storage capacity, good processability, flexible and light weight. The devices can be fabricated by forming a composite active layer and switch with two electrodes. Unlike inorganic memories which are based on the amount of charges stored in the devices, the memory effect in organic memory devices is based on the electrical bistability of conductance (resistance), where a low-conductance (OFF) state switches to a high-conductance (ON) state [Yang et al., *Adv. Funct. Mater.* 2006, 16, 1001; Scott, J. C.; Bozano, L. D.; *Adv. Mater* 2007, 19, 1452; Heremans et al., *Chem. Mater.* 2011, 23, 341]. To achieve electrical bistability in organic systems, donor-acceptor couples have to be employed and they have been demonstrated as one of the successful approaches involving electric-field-induced charge transfer between conjugated compounds.

SUMMARY

By varying the donor and acceptor strengths and the selection of different acceptors, the memory effect can be modulated. The donor-acceptor compounds containing boron(III) moieties as electron acceptor unit described herein provide a simple means to employ boron(III)-containing donor-acceptor compounds as active components for the fabrication of optical reflectors and organic memory devices. The thin films prepared by the said compounds of the invention are found to exhibit golden-like metallic luster behavior with the percentage reflectance of the film found to be as high as 43% and the reflective region covering from 450 nm to 1300 nm, which is the entire visible to near-infrared region. A high ON/OFF ratio of up to $10^7$, low threshold voltage of <2.5 V and low reading potential of less than 1 V can be achieved for organic memory devices. Various memory types can also be achieved by incorporation of different aromatic donor groups.

Described herein is the utilization of donor-acceptor compounds containing boron(III) moieties as electron acceptor unit having a chemical structure represented by the following general formula (I) as active materials for the fabrication of optical reflectors and organic memory devices.

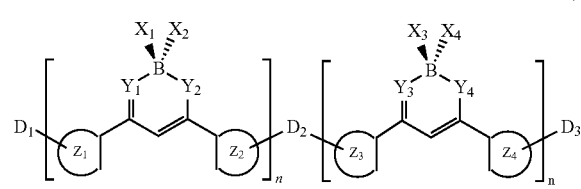

(I)

wherein
a) B is a boron atom;
b) Each boron atom can attach optionally one or two of the $X_1$, $X_2$, $X_3$ and $X_4$ and two of the $Y_1$, $Y_2$, $Y_3$, and $Y_4$;
c) $X_1$, $X_2$, $X_3$ and $X_4$ are independently a heteroatom or carbon atom, where the heteroatom or group can be F, Cl, Br, I, or OR, and R is a substituent on specific heteroatom or carbon atom which can be selected from alkyl or aromatic groups;
d) $Y_1$, $Y_2$, $Y_3$, and $Y_4$ are independently a heteroatom, where the heteroatom or group can either be O, S, Se, Ge, Te, PR, or NR, and R is a substituent on specific heteroatom or carbon atom which can be selected from alkyl or aromatic groups;
e) $Z_1$, $Z_2$, $Z_3$, and $Z_4$ are cyclic structure derivatives;
f) $D_1$, $D_2$ and $D_3$ are optionally alkyl substituted aromatic groups; and
g) n and m can optionally be any integer.

It is found that the incorporation of different donating aromatic groups into the boron(III) containing backbone can effectively induce the donor-acceptor property of these compounds. Preferred compounds of the invention are thermally stable and soluble in most of the organic solvents and can readily form a thin film by spin-coating.

DETAILED DESCRIPTION

Figure 1:
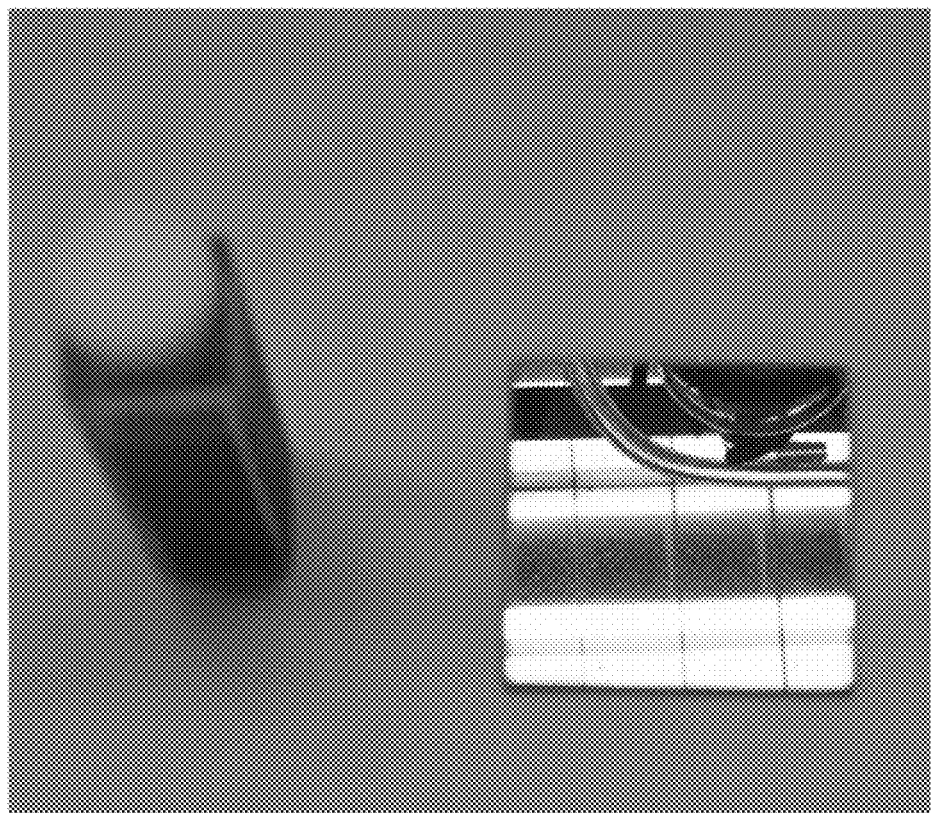
FIG. 1 shows the image of a solution of compound 1 in dichloromethane (left) and a thin film of compound 1 coated onto a quartz plate exhibiting gold-like reflective behavior by showing the reflected image from a fluorescent lamp (right) viewed from the top.

Described herein is the utilization of donor-acceptor compounds containing boron(III) moieties as electron acceptor unit having a chemical structure represented by the following general formula (I) as active materials for the fabrication of optical reflectors and organic memory devices. More specifically, the donor-acceptor compound has boron(III) backbone with or without heteroatom, in which at least one substituent is being attached onto the boron(III) backbone, and various substituents on specific heteroatom or carbon atom. The donor-acceptor compounds have the chemical structure shown in the generic formula (I):

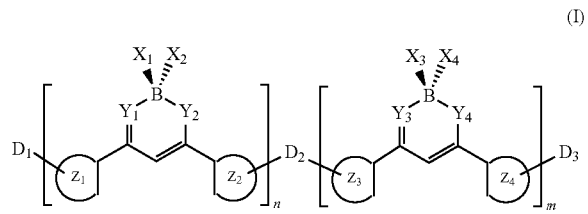

(I)

wherein
a) B is a boron atom;
b) Each boron atom can attach optionally one or two of the $X_1$, $X_2$, $X_3$ and $X_4$ and two of the $Y_1$, $Y_2$, $Y_3$, and $Y_4$;
c) $X_1$, $X_2$, $X_3$ and $X_4$ are independently a heteroatom or carbon atom, where the heteroatom or group can be F, Cl, Br, I, or OR, and R is a substituent on specific heteroatom or carbon atom which can be selected from alkyl or aromatic groups;
d) $Y_1$, $Y_2$, $Y_3$, and $Y_4$ are independently a heteroatom, where the heteroatom or group can either be O, S, Se, Ge, Te, PR, or NR, and R is a substituent on specific heteroatom or carbon atom which can be selected from alkyl or aromatic groups;
e) $Z_1$, $Z_2$, $Z_3$, and $Z_4$ are cyclic structure derivatives;
f) $D_1$, $D_2$ and $D_3$ are optionally alkyl substituted aromatic groups; and
g) n and m can optionally be any integer.

$X_1$, $X_2$, $X_3$ and $X_4$ are the heteroatom attached to the boron(III) backbone with optional substituent R. Examples of heteroatoms are fluorine, chlorine, bromine, iodine, sulfur, nitrogen, oxygen, phosphorus, germanium, selenium or tellurium.

$X_1$, $X_2$, $X_3$ and $X_4$ can be carbon atom with optional substituent R.

$X_1$, $X_2$, $X_3$ and $X_4$ can also be the oxidized form of the selected heteroatom, i.e. sulfinyl, sulfonyl or phosphoryl, selenyl, seleonyl, or tellurinyl, etc.

$Y_1$; $Y_2$, $Y_3$, and $Y_4$ are the heteroatom of the aromatic backbone attached to the boron(III) atom with optional substituent R. Examples of heteroatoms are oxygen, sulfur, selenium, phosphorus, nitrogen, and carbon.

R is the substituent on specific heteroatom or carbon atom of the boron(III) backbone, which can be independently varied from the heteroatom or carbon atom itself. R can be independently alkyl, substituted alkyl, heteroaryl, substituted heteroaryl, a non-limiting list of examples include alkoxy, substituted alkoxy, aryl, substituted aryl, arylalkoxy, substituted arylalkoxy, thiophene, oligo-thiophenes, fused-thiophenes.

Rings $Z_1$, $Z_2$, $Z_3$, and $Z_4$ are independently selected from a 5- or 6-membered arene, heteroarene or heterocycle derivatives. Examples of arenes or heteroarenes are benzene, pyridine, thiophene, furan, fused-thiophene, pyrazole, pyrimidine, pyrrole, selenophene, tellurophene, benzimidazole, benzofuran, benzothiazole, benzoxazole, benzophosphole, indole, indane, naphthalene, anthracene, pyrene, thi-azole, pyran, thiapyran, carbazole, dibenzothiophene, dibenzofuran, dibenzosilole, fluorene, dibenzophosphole and derivatives thereof.

$D_1$, $D_2$ and $D_3$ are the optionally substituted aromatic group attached to the boron(III) backbone which can be independently selected. Examples of alkyl or aromatic groups are alkylamino, arylamine, thiophene, oligo-thiophenes, fused-thiophenes, fluorene, dibenzothiophene, dibenzofuran, dibenzophosphole, benzothiadiazole, thiazolothiazole, benzodithiophene and derivatives thereof.

n and m can optionally be any integer. Examples of integer numbers are 0, 1 and 2, etc.

In the present disclosure the following terms are used.

The term "optional" or "optionally" means that the subsequently described event or circumstance may or may not occur, and that the description includes instances where the said event or circumstance occurs and instances in which it does not. For example, "optionally substituted alkyl" includes "alkyl" and "substituted alkyl," as defined below.

The term "alkyl" as used herein includes both straight and branched chain alkyl groups. Preferred alkyl groups are those containing from one to eighteen carbon atoms and includes methyl, ethyl, propyl, isopropyl, butyl, isobutyl, tert-butyl, and the like.

The term "alkoxy" as used herein includes both straight and branched chain alkyl groups attached to the present structure through an oxygen. Preferred alkoxy groups are those containing from one to eighteen carbon atoms and includes methoxy, ethoxy, propoxy, isopropoxy, and the like.

The term "arylalkoxy" as used herein includes an aromatic groups attached to the parent structure through an oxygen. Preferred arylalkoxy groups are those containing 3 to 7 carbon atoms and include phenoxy, and the like.

Substituted refers to any level of substitution although mono-, di- and tri-substitutions are preferred. Examples of substituents include hydrogen, halogen, aryl, alkyl, heteroaryl, alkoxy, arylalkoxy, hydroxy, carboxylates, carboxyesters, thiol, alkyl and aryl sulfide, amines, nitriles, nitro, enamines, hydrazides and amine oxides.

The term "halo" or "halogen" as used herein includes fluorine, chlorine, bromine and iodine.

Aryl alone or in combination includes carbocyclic aromatic systems. The systems may contain one, two, three or four rings wherein each ring may be attached together in a pendant manner or may be fused. Preferably the rings are 5- or 6-membered rings.

Heteroaryl or in combination includes carbocyclic heteroaromatic systems. The systems may contain one, two, three or four rings wherein each ring may be attached together in a pendant manner or may be fused. Typically the rings are 5- or 6-membered rings. This includes heteroaromatic rings including but not limited to pyridine, thiophene, fused-thiophene, furan, pyrazole, pyrimidine, pyrrole, selenophene, tellurophene, benzimidazole, benzofuran, benzophosphole, benzothiazole, benzoxazole, indole, thiazole, pyran, thiapyran, carbazole, dibenzothiophene, dibenzofuran, dibenzosilole, dibenzophosphole, benzothiadiazole, thiazolothiazole, benzodithiophene. The groups can be substituted or unsubstituted. Examples of substituents include but not limited to alkyl, alkoxy, aryl.

Heterocyclic and heterocycle refer to a 3 to 7-member ring containing at least one heteroatom. This includes heteroaromatic rings including but not limited to pyridine, thiophene, fused-thiophene, furan, pyrazole, pyrimidine, pyrrole, selenophene, tellurophene, benzimidazole, benzofuran, benzophosphole, benzothiazole, benzoxazole, indole, thiazole, pyran, thiapyran, carbazole, dibenzothiophene, dibenzofuran, dibenzosilole, dibenzophosphole, benzothiadiazole, benzodithiophene. The groups can be substituted or unsubstituted. Examples of substituents include but not limited to alkyl, alkoxy, aryl.

Benzene includes substituted or unsubstituted benzene.

Pyridine includes substituted or unsubstituted pyridine.

Thiophene includes substituted or unsubstituted thiophene.

Furan includes substituted or unsubstituted furan.

Fused-thiophene includes substituted or unsubstituted fused-thiophene.

Pyrazole includes substituted or unsubstituted pyrazole.

Pyrimidine includes substituted or unsubstituted pyrimidine.

Pyrrole includes substituted or unsubstituted pyrrole.

Selenophene includes substituted or unsubstituted selenophene.

Tellurophene includes substituted or unsubstituted tellurophene.

Benzimidazole includes substituted or unsubstituted benzimidazole.

Benzofuran includes substituted or unsubstituted benzofuran.

Benzothiazole includes substituted or unsubstituted benzothiazole.

Benzoxazole includes substituted or unsubstituted benzoxazole.

Benzophosphole includes substituted or unsubstituted benzophosphole.

Indole includes substituted or unsubstituted indole.

Indane includes substituted or unsubstituted indane.

Naphthalene includes substituted or unsubstituted naphthalene.

Anthracene includes substituted or unsubstituted anthracene.

Pyrene includes substituted or unsubstituted pyrene.

Thiazole includes substituted or unsubstituted thiazole.

Pyran includes substituted or unsubstituted pyran.

Thiapyran includes substituted or unsubstituted thiapyran.

Carbazole includes substituted or unsubstituted carbazole.

Dibenzothiophene includes substituted or unsubstituted dibenzothiophene.

Dibenzofuran includes substituted or unsubstituted dibenzofuran.

Dibenzosilole includes substituted or unsubstituted dibenzosilole.

Fluorene includes substituted or unsubstituted fluorene.

Dibenzophosphole includes substituted or unsubstituted dibenzophosphole.

Benzothiadiazole includes substituted or unsubstituted benzothiadiazole.

Thiazolothiazole includes substituted or unsubstituted thiazolothiazole.

Benzodithiophene includes substituted or unsubstituted benzodithiophene.

Figure 2:
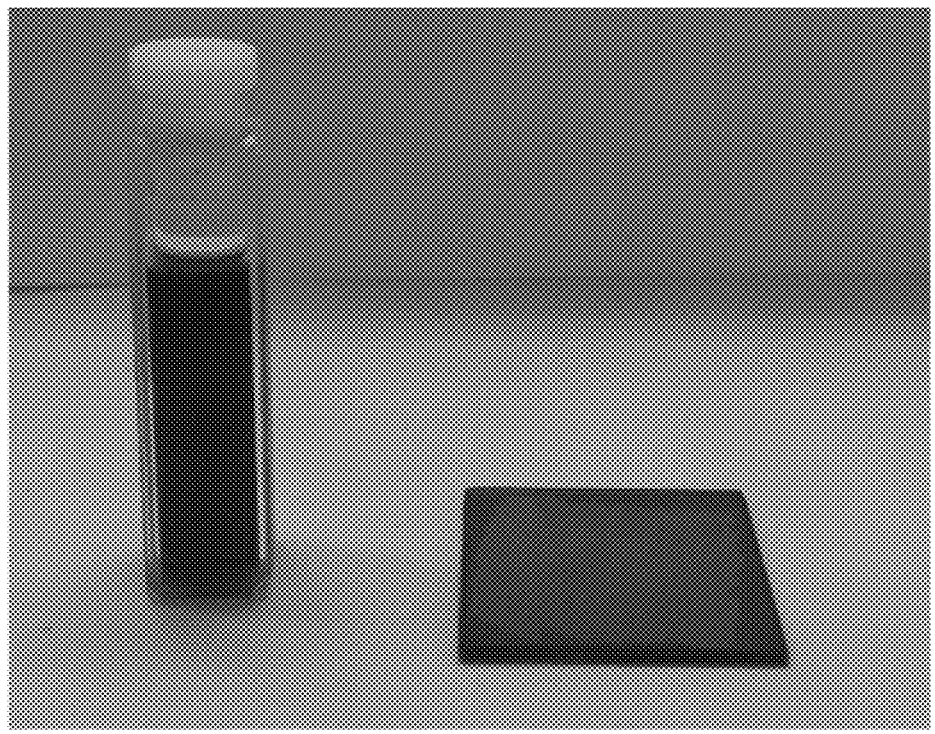
FIG. 2 shows image of a solution of compound 1 in dichloromethane (left) and a thin film of compound 1 coated on quartz plate (right) viewed from the side.

The thin film prepared by the donor-acceptor compounds described herein exhibits golden-like metallic luster behavior, as shown in FIG. 1 and FIG. 2. The percentage reflectance of golden-like metallic luster film was found to be as high as 43% (that is, from 1% to 43%) and the reflective region was found to cover 450 nm to 1300 nm, which is the entire visible to near-infrared region, specifically including 500 nm to 800 nm Such reflective film is useful as optical reflector. Unlike the recent development in optical reflectors, where photonic crystals require 3D morphology design and Bragg reflectors require multi-layer engineering, a simple preparation method by spin-coating is only required for the use of the donor-acceptor compounds as optical reflectors.

Figure 3:
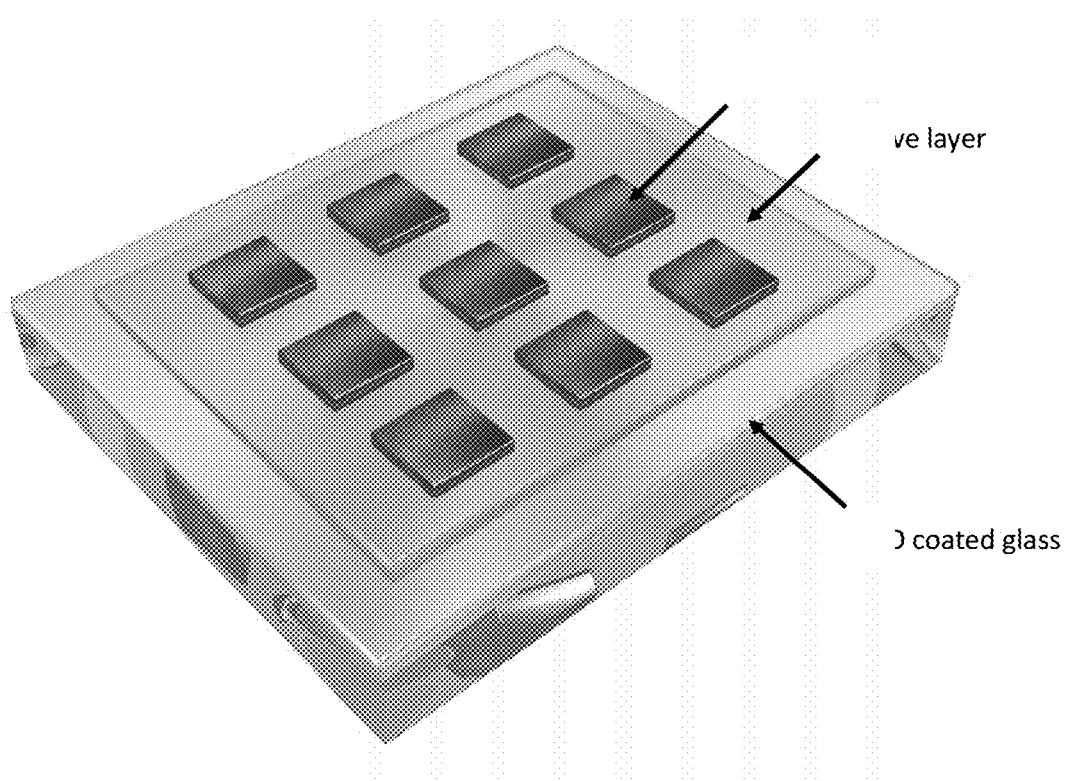
FIG. 3 shows the structure of an organic memory device using the boron(III)-containing donor-acceptor compounds of the present invention as active material.

Apart from exhibiting optical reflectance, the donor-acceptor compounds have also been shown to serve as organic memories. The typical structure of an organic memory device using the donor-acceptor compounds as active layer materials is in the order shown in FIG. 3: aluminum/active layer/ITO coated glass, in which the boron (III)-containing donor-acceptor compound was spin-coated onto the ITO coated glass and then a layer of aluminum was thermally deposited with mask on the former. The size of the ITO coated glass is 2 cm×2 cm, in which 400 individual devices are deposited on it. Particularly, a high ON/OFF ratio of up to $10^7$, a low threshold voltage of less than 2.5 V and a low reading potential of less than 1 V can be achieved. Various memory types can also be achieved by incorporation of different donor aromatic groups.

The following examples illustrate the subject invention. Unless otherwise indicated in the following examples and elsewhere in the specification and claims, all parts and percentages are by weight, all temperatures are in degrees Centigrade, and pressure is at or near atmospheric pressure.

The cost of organic material employed to make the materials described herein is less expensive than using conventional inorganic material. The resultant light weight, the relative ease of processing (solution processing) and/or low production cost of the organic materials described herein make the inventive aspects more competitive than conventional inorganic compounds.

Various specific advantages are associated with the donor-acceptor compounds described herein. The donor-acceptor compounds are highly novel. The donor-acceptor compounds are discrete molecules that are monodisperse in nature with well-defined chemical structure and can be well reproduced in high purity, comparing with polymers. The donor-acceptor compounds have a simple fabrication process of using solution-processing. The donor-acceptor compounds have a unique gold-like metallic luster appearance of boron(III) compounds. The donor-acceptor compounds have a high on/off ratio, low threshold voltage, low reading potential and great stability can be achieved by using those compounds as organic memory devices.

Using boron(III) containing donor-acceptor for organic devices and the metallic luster properties of the boron compounds is another novel aspect. Consequently, the reflectivity as optical reflector can be improved, and solubility and retention time for both reflector and memory devices can also be improved.

EXAMPLE 1

Synthesis and Characterization of Boron(III) Compounds

Compounds 1-11 were synthesized according to the following methodology. The desired compounds were synthesized using the standard Stille coupling reaction of bromo-thiophene boron(III) backbone with the target organotin reagents of the donor moiety. For example, [Pd(PPh$_3$)$_4$] was added to a mixture of 9-(2-ethylhexyl)-2,7-bis(5-(trimethylstannyl)thiophen-2-yl)-9H-carbazole and bromo-thiophene boron(III) compound in dry toluene/DMF (10:1 v/v). The reaction mixture was heated to reflux overnight under nitrogen. The reaction mixture was then extracted with dichloromethane and washed with deionized water several times. The crude organic layer was dried over anhydrous MgSO$_4$, filtered, and reduced under vacuum. The crude product was purified by column chromatography over silica using dichloromethane-hexane as eluent. Further purification was achieved by recrystallization with chloroform-methanol.
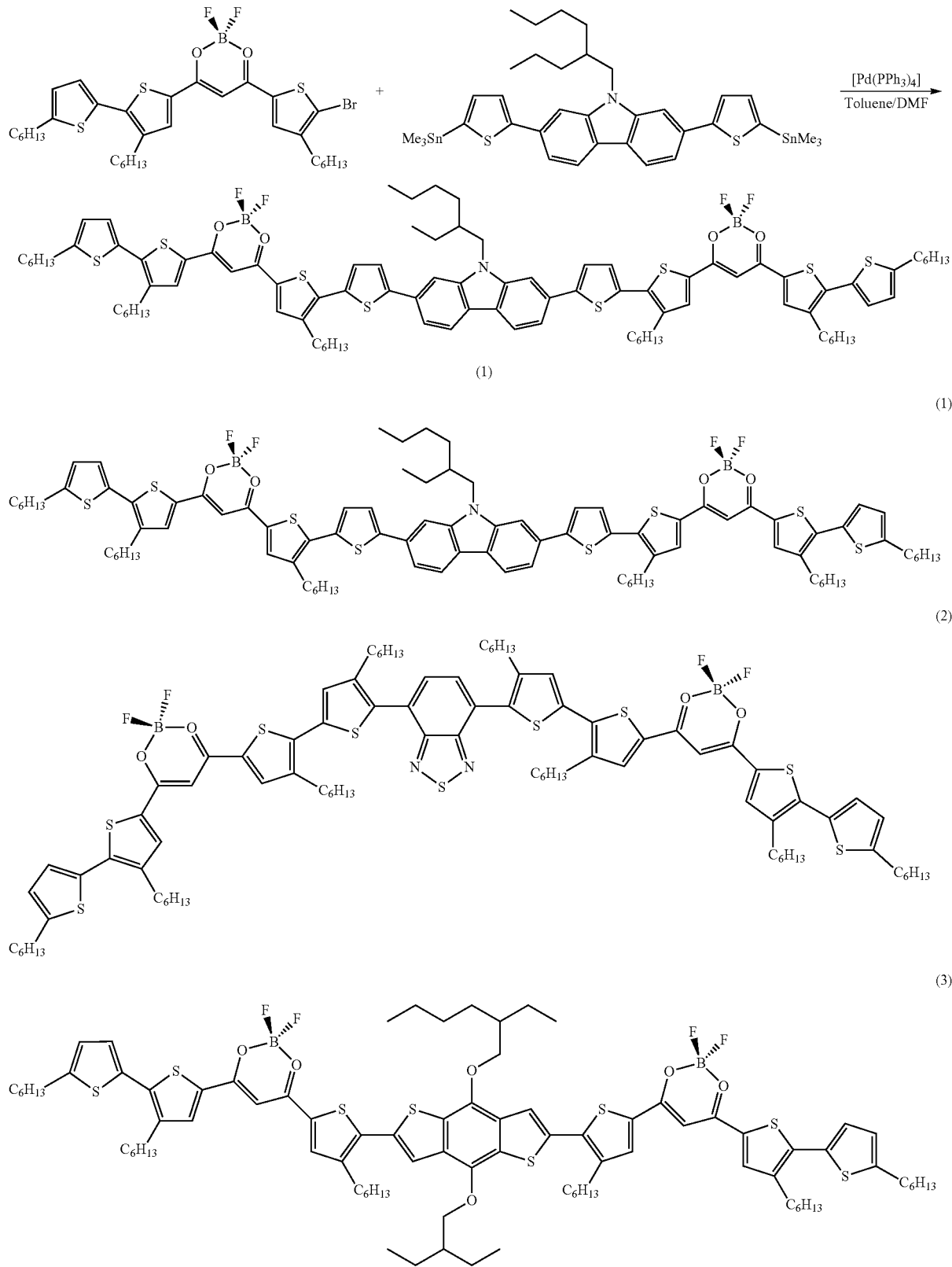

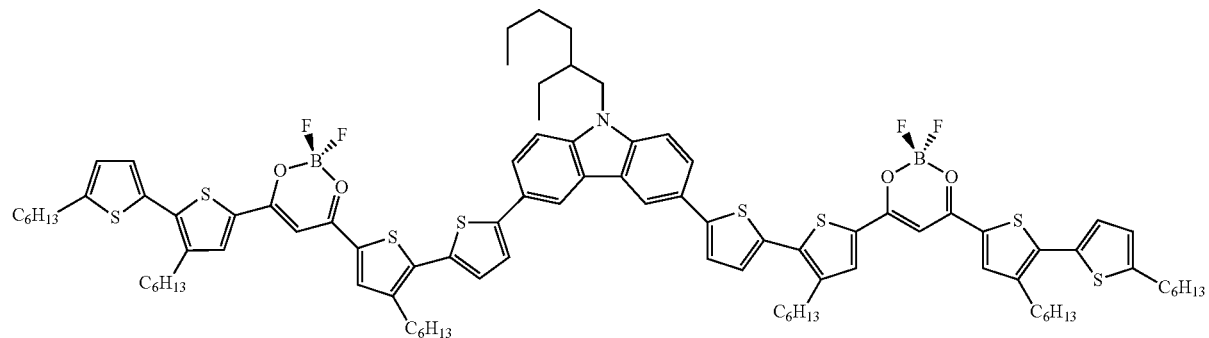
(4)
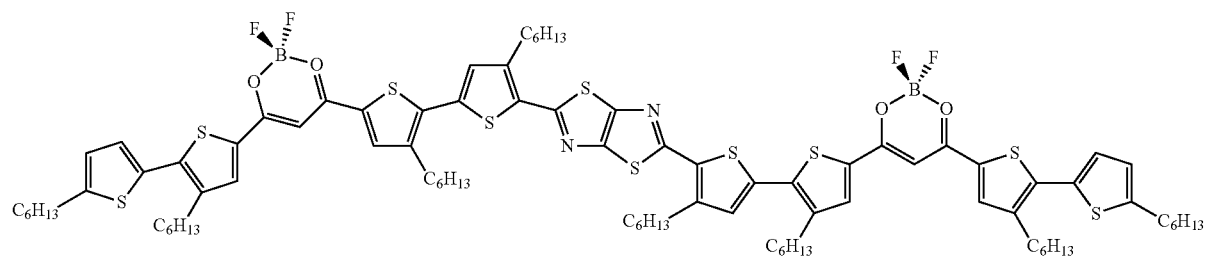
(5)
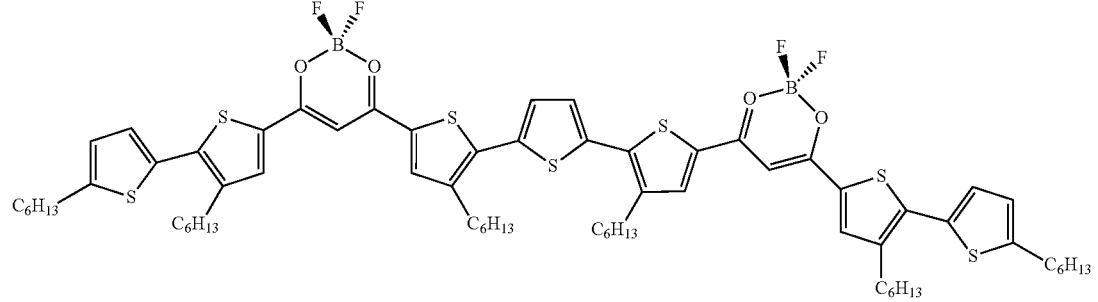
(6)
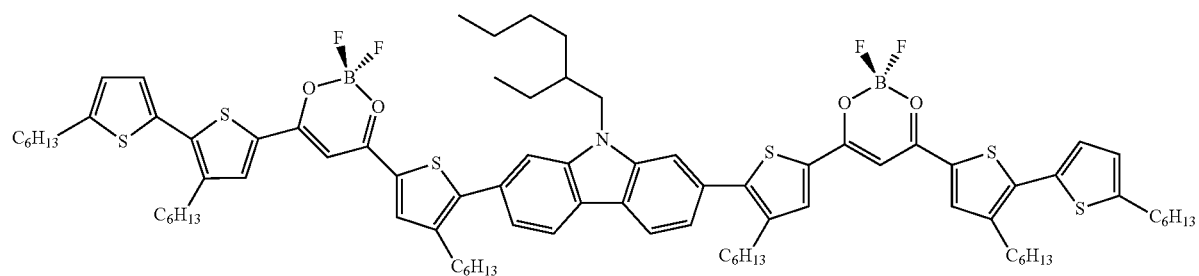
(7)
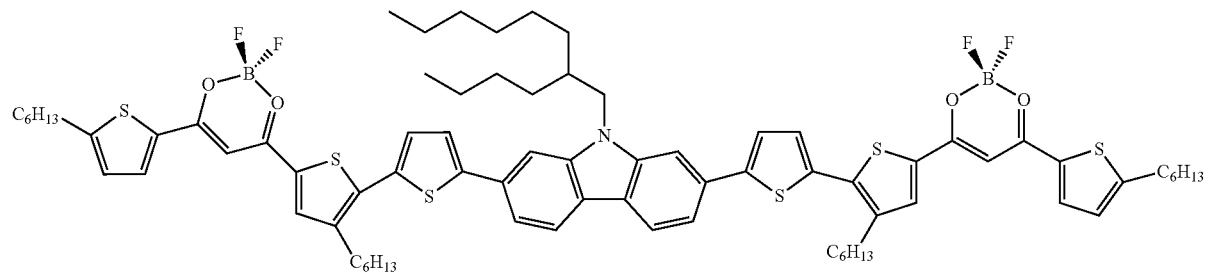
(8)

-continued (9)

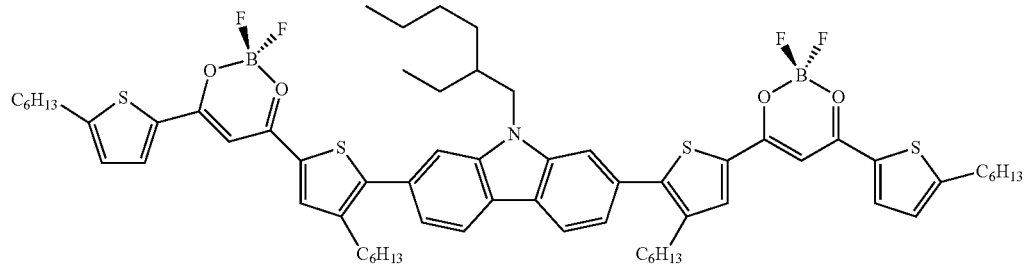

(10)

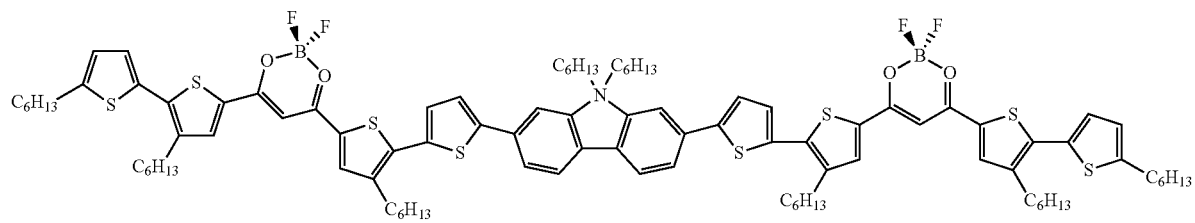

(11)

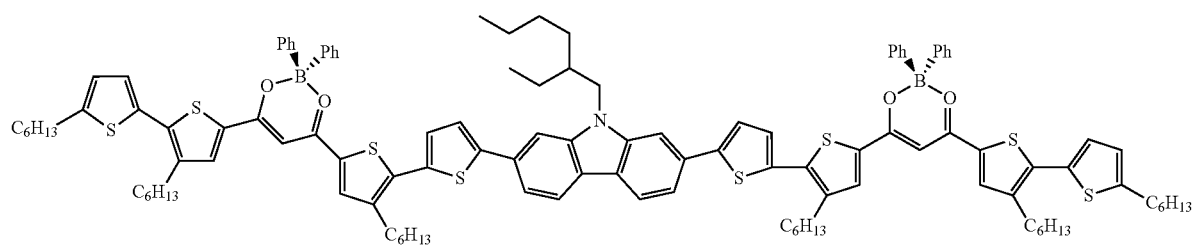

The characteristic spectroscopic properties of compounds 1-11 are as follows:

Compound 1
Yield: 55%. $^1$H NMR (500 MHz, CD$_2$Cl$_2$, 298 K, relative to Me$_4$Si/ppm): δ 0.89-0.92 (t, 12H, 6.8 Hz), 0.93-0.97 (m, 6H), 0.99-1.02 (m, 6H), 1.21-1.26 (m, 6H), 1.31-1.48 (m, 26H), 1.71-1.74 (m, 8H), 2.62 (t, 4H, 7.5 Hz), 2.67 (t, 4H, 7.5 Hz), 2.73 (t, 4H, 7.5 Hz), 3.22-3.32 (m, 2H), 6.39 (s, 2H), 6.65 (s, 2H), 6.90 (s, 2H), 6.95 (s, 2H), 7.08 (s, 4H), 7.16 (d, 2H, 7.8 Hz), 7.53 (d, 4H, 10.0 Hz), 7.70 (d, 2H, 7.8 Hz). $^{19}$F{H} NMR (376.4 MHz, CDCl$_3$, 298 K, relative to CFCl$_3$/ppm): δ -141.88 (s). $^{11}$B{H} NMR (160.5 MHz, CDCl$_3$, 298 K, relative to BF$_3$·OEt$_2$/ppm): δ 3.55 (s). HRMS (MALDI-TOF) calcd. for C$_{94}$H$_{115}$B$_2$F$_4$NO$_4$S$_8$: m/z=1677.6828. found: 1677.6908 [M]$^+$.

Compound 2
Yield: 57%. $^1$H NMR (500 MHz, CD$_2$Cl$_2$, 298 K, relative to Me$_4$Si/ppm): δ 0.84 (t, 6H, 6.8 Hz), 0.89-0.92 (m, 18H), 1.23-1.30 (m, 8H), 1.33-1.50 (m, 42H), 1.65-1.79 (m, 18H), 2.72 (t, 4H, 7.8 Hz), 2.81-2.88 (m, 4H), 2.92 (t, 4H, 7.8 Hz), 6.73 (s, 2H), 6.83 (d, 2H, 3.7 Hz), 7.20 (d, 2H, 3.7 Hz), 7.39 (s, 2H), 7.88 (s, 2H) 7.90 (s, 2H). $^{19}$F{H} NMR (376.4 MHz, CDCl$_3$, 298 K, relative to CFCl$_3$/ppm): δ -141.60 (s). $^{11}$B{H} NMR (160.5 MHz, CDCl$_3$, 298 K, relative to BF$_3$·OEt$_2$/ppm): δ 3.82 (s). HRMS (MALDI-TOF) calcd. for C$_{92}$H$_{118}$B$_2$F$_4$N$_2$O$_4$S$_9$: m/z=1701.6734. found: 1701.6862 [M]$^+$.

Compound 3
Yield: 41%. $^1$H NMR (500 MHz, CD$_2$Cl$_2$, 298 K, relative to Me$_4$Si/ppm): δ 0.88-1.03 (m, 24H), 1.10-1.13 (m, 6H), 1.33-1.45 (m, 40H), 1.56-1.59 (m, 6H), 1.62-1.78 (m, 12H), 1.80-1.92 (m, 8H), 2.63-2.67 (m, 4H), 2.74-2.78 (m, 4H), 2.99-3.05 (m, 4H), 4.07-4.10 (m, 4H), 6.63 (s, 2H), 6.3 (s, 2H), 6.99 (s, 2H), 7.31 (s, 2H), 7.65 (s, 2H), 7.74 (s, 2H). $^{19}$F{H} NMR (376.4 MHz, CDCl$_3$, 298 K, relative to CFCl$_3$/ppm): δ -141.30 (s). $^{11}$B{H} NMR (160.5 MHz, CDCl$_3$, 298 K, relative to BF$_3$·OEt$_2$/ppm): δ 3.67 (s). HRMS (MALDI-TOF) calcd. for C$_{92}$H$_{124}$B$_2$F$_4$O$_6$S$_8$: m/z=1679.7384. found: 1679.7232 [M]$^+$.

Compound 4
Yield: 54%. $^1$H NMR (500 MHz, CD$_2$Cl$_2$, 298 K, relative to Me$_4$Si/ppm): δ 0.86-0.94 (m, 18H), 0.98 (t, 6H, 7.0 Hz), 1.25-1.54 (m, 44H), 1.64-1.69 (m, 8H), 1.70-1.80 (m, 4H), 1.98-2.05 (m, 1H), 2.71 (t, 4H, 8.1 Hz), 2.78-2.84 (m, 8H), 3.92-3.94 (m, 2H), 6.55 (s, 2H), 6.74 (s, 2H), 7.08 (s, 2H), 7.14 (d, 2H, 8.4 Hz), 7.26 (s, 4H), 7.50 (d, 2H, 8.4 Hz), 7.71 (d, 2H, 10.5 Hz), 8.02 (s, 2H). $^{19}$F{H} NMR (376.4 MHz, CDCl$_3$, 298 K, relative to CFCl$_3$/ppm): δ -141.75 (s). $^{11}$B{H} NMR (160.5 MHz, CDCl$_3$, 298 K, relative to BF$_3$·OEt$_2$/ppm): δ 3.75 (s). HRMS (MALDI-TOF) calcd. for C$_{94}$H$_{115}$B$_2$F$_4$NO$_4$S$_8$: m/z=1677.6828. found: 1677.6796 [M]$^+$.

Compound 5
Yield: 39%. $^1$H NMR (500 MHz, CD$_2$Cl$_2$, 298 K, relative to Me$_4$Si/ppm): δ 0.88 (t, 6H, 7.0 Hz), 0.93 (t, 6H, 6.8 Hz), 0.96-1.03 (m, 12H), 1.26-1.37 (m, 16H), 1.45-1.50 (m, 16H), 1.56-1.67 (m, 32H), 2.12-2.55 (m, 16H), 6.12 (s, 2H), 6.34 (s, 2H), 6.69 (s, 2H), 6.77 (s, 2H), 6.85 (s, 2H), 7.12 (s, 2H), 7.28 (s, 2H). $^{19}$F{H} NMR (376.4 MHz, CDCl$_3$, 298 K, relative to CFCl$_3$/ppm): δ -141.34 (s). $^{11}$B{H} NMR (160.5 MHz, CDCl$_3$, 298 K, relative to BF$_3$·OEt$_2$/ppm): δ 3.22 (s). HRMS (MALDI-TOF) calcd. for C$_{90}$H$_{116}$B$_2$F$_4$N$_2$O$_4$S$_{10}$: =1707.6298. found: 1707.6373 [M]$^+$.

Compound 6

Yield: 32%. $^1$H NMR (500 MHz, CD$_2$Cl$_2$, 298 K, relative to Me$_4$Si/ppm): δ 0.90-0.98 (m, 18H), 1.32-1.44 (m, 36H), 1.65-1.71 (m, 8H), 1.76-1.79 (m, 4H), 2.72 (t, 4H, 7.8 Hz), 2.77-2.82 (m, 8H), 6.64 (s, 2H), 6.71 (d, 2H, 3.5 Hz), 7.04 (d, 2H, 3.5 Hz), 7.21 (s, 2H), 7.73 (s, 2H). $^{19}$F{H} NMR (376.4 MHz, CDCl$_3$, 298 K, relative to CFCl$_3$/ppm): δ −141.75 (s). $^{11}$B{H} NMR (160.5 MHz, CDCl$_3$, 298 K, relative to BF$_3$·OEt$_2$/ppm): δ 3.66 (s). HRMS (MALDI-TOF) calcd. for C$_{70}$H$_{90}$B$_2$F$_4$O$_4$S$_7$: m/z=1316.5022. found: 1316.4980 [M]$^+$.

Compound 7

Yield: 46%. $^1$H NMR (500 MHz, CD$_2$Cl$_2$, 298 K, relative to Me$_4$Si/ppm): δ 0.84-0.94 (m, 24H), 1.23-1.44 (m, 4H), 1.68-1.72 (m, 12H), 1.95-2.01 (m, 1H), 2.75-2.79 (m, 8H), 2.84 (t, 4H, 7.6 Hz), 3.72-3.75 (m, 2H), 6.78-6.80 (m, 4H), 7.12 (s, 2H), 7.24 (s, 2H), 7.32 (d, 2H, 7.9 Hz), 7.82 (s, 2H), 7.96 (s, 2H), 8.05 (d, 2H, 7.9 Hz). $^{19}$F{H} NMR (376.4 MHz, CDCl$_3$, 298 K, relative to CFCl$_3$/ppm): δ −141.27 (s). $^{11}$B{H} NMR (160.5 MHz, CDCl$_3$, 298 K, relative to BF$_3$·OEt$_2$/ppm): δ 3.83 (s). HRMS (MALDI-TOF) calcd. for C$_{86}$H$_{111}$B$_2$F$_4$NO$_4$S$_6$: m/z=1511.6979. found: 1511.6952 [M]$^+$.

Compound 8

Yield: 39%. $^1$H NMR (500 MHz, CD$_2$Cl$_2$, 298 K, relative to Me$_4$Si/ppm): δ 0.80-0.95 (m, 18H), 1.23-1.51 (m, 40H), 1.71-1.79 (m, 8H), 2.12-2.20 (m, 1H), 2.88-2.94 (m, 8H), 4.01-4.05 (m, 2H), 6.69 (s, 2H), 6.98 (d, 2H, 3.9 Hz), 7.36 (d, 2H, 3.9 Hz), 7.41 (d, 2H, 3.9 Hz), 7.49-7.53 (m, 4H), 7.85 (s, 2H), 7.88 (d, 2H, 3.9 Hz), 8.06 (d, 2H, 8.0 Hz). $^{19}$F{H} NMR (376.4 MHz, CDCl$_3$, 298 K, relative to CFCl$_3$/ppm): δ −141.08 (s). $^{11}$B{H} NMR (160.5 MHz, CDCl$_3$, 298 K, relative to BF$_3$·OEt$_2$/ppm): δ 3.78 (s). HRMS (MALDI-TOF) calcd. for C$_{78}$H$_{95}$B$_2$F$_4$NO$_4$S$_6$: m/z=1399.5725. found: 1399.5650 [M]$^+$.

Compound 9

Yield: 52%. $^1$H NMR (500 MHz, CD$_2$Cl$_2$, 298 K, relative to Me$_4$Si/ppm): δ 0.83-0.95 (m, 18H), 1.25-1.42 (m, 32H), 1.68-1.78 (m, 8H), 2.08-2.15 (m, 1H), 2.83 (t, 4H, 7.6 Hz), 2.94 (t, 4H, 7.6 Hz), 4.16-4.2 (m, 2H), 6.78 (s, 2H), 7.01 (d, 2H, 3.0 Hz), 7.41 (d, 2H, 7.1 Hz), 7.53 (s, 2H), 7.93 (d, 2H, 3.0 Hz), 7.99 (s, 2H), 8.12 (d, 2H, 7.1 Hz). $^{19}$F{H} NMR (376.4 MHz, CDCl$_3$, 298 K, relative to CFCl$_3$/ppm): δ −141.62 (s). $^{11}$B{H} NMR (160.5 MHz, CDCl$_3$, 298 K, relative to BF$_3$·OEt$_2$/ppm): δ 10.47 (s). HRMS (MALDI-TOF) calcd. for C$_{66}$H$_{83}$B$_2$F$_4$NO$_4$S$_4$: m/z=1179.5342. found: 1179.525 [M]$^+$.

Compound 10

Yield: 45%. $^1$H NMR (500 MHz, CD$_2$Cl$_2$, 298 K, relative to Me$_4$Si/ppm): δ 0.72-0.78 (m, 12H), 0.89-0.95 (m, 18H), 1.04-1.15 (m, 12H), 1.31-1.51 (m 34H), 1.68-1.80 (m, 12H), 2.07-2.12 (m, 4H), 2.80-2.87 (m, 8H), 2.91 (t, 4H, 7.5 Hz), 6.70 (s, 2H), 7.19 (s, 2H), 7.39 (d, 2H, 3.8 Hz), 7.45 (d, 2H, 3.8 Hz), 7.64-7.62 (m, 4H), 7.71 (d, 2H, 7.7 Hz), 7.87 (d, 2H, 7.7 Hz). $^{19}$F{H} NMR (376.4 MHz, CDCl$_3$, 298 K, relative to CFCl$_3$/ppm): δ −141.48 (s). $^{11}$B{H} NMR (160.5 MHz, CDCl$_3$, 298 K, relative to BF$_3$·OEt$_2$/ppm): δ 3.80 (s). HRMS (MALDI-TOF) calcd. for C$_{99}$H$_{124}$B$_2$F$_4$O$_4$S$_8$: m/z=1731.742466. found: 1712.9580 [M-F]$^+$.

Compound 11

Yield: 34%. $^1$H NMR (500 MHz, CD$_2$Cl$_2$, 298 K, relative to Me$_4$Si/ppm): δ 0.89-1.00 (m, 24H), 1.26-1.49 (m, 44H), 1.66-1.77 (m 12H), 2.08-2.15 (m, 1H), 2.80 (t, 4H, 7.7 Hz), 2.85 (t, 4H, 7.6 Hz), 2.89 (t, 4H, 7.8 Hz), 4.14-4.20 (m, 2H), 6.56 (s, 2H), 6.81 (d, 2H, 3.8 Hz), 7.17-7.20 (m, 6H), 7.26 (t, 8H, 7.3 Hz), 7.37 (d, 2H, 3.8 Hz), 7.43 (d, 2H, 3.8 Hz), 7.53 (d, 2H, 8.0 Hz), 7.58-7.61 (m, 10H), 7.76 (s, 4H), 8.06 (d, 2H, 8.0 Hz). $^{11}$B{H} NMR (160.5 MHz, CDCl$_3$, 298 K, relative to BF$_3$·OEt$_2$/ppm): δ 3.95 (s). HRMS (MALDI-TOF) calcd. for C$_{118}$H$_{135}$B$_2$NO$_4$S$_8$: m/z=1908.8383. found: 1832.0542 [M-Ph]$^+$.

EXAMPLE 2

UV-Vis Absorption Properties

All boron(III)-containing donor-acceptor compounds show an intense absorption band at ca. 480-565 nm which is attributed to the intramolecular charge transfer (ICT) absorption. TABLE 1 summarizes the absorption properties of these compounds in CH$_2$Cl$_2$ and in neat film. By decreasing the number of thiophene groups in the boron(III) backbone, compounds 1, 7, 8 and 9 show progressively blue-shifted absorption bands. The UV-vis absorption spectrum of compound 11 is found to be blue-shifted, as compared to compound 1. This is due to the attachment of the phenyl ring to the boron atom in 11, which has poorer electron-withdrawing ability than that of the fluoro substituent on the boron atom in 1. The absorption of the neat film is found to be red-shifted, indicative of a pronounced aggregation of the boron(III)-containing donor-acceptor compounds in the neat film.

TABLE 1

| Compound | Medium | Absorption $\lambda_{max}$ [nm] $\varepsilon_{max}$ in solution [dm$^3$mol$^{-1}$cm$^{-1}$] |
|---|---|---|
| 1 | CH$_2$Cl$_2$ | 383 (29700), 560 (114000) |
|   | neat film | 396, 590, 635 (sh) |
| 2 | CH$_2$Cl$_2$ | 318 (36800), 546 (151200) |
|   | neat film | 328, 573 |
| 3 | CH$_2$Cl$_2$ | 287 (28800), 323 (sh), 377 (22800), 565 (115000) |
|   | neat film | 298, 516 (sh), 603 |
| 4 | CH$_2$Cl$_2$ | 324 (48000), 370 (35900), 553 (140300) |
|   | neat film | 331, 570 |
| 5 | CH$_2$Cl$_2$ | 322 (18700), 409 (sh), 565 (128400) |
|   | neat film | 465, 600, 670 (sh) |
| 6 | CH$_2$Cl$_2$ | 314 (13400), 564 (78500) |
|   | neat film | 342, 597, 662 (sh) |
| 7 | CH$_2$Cl$_2$ | 321 (31400), 527 (158900) |
|   | neat film | 350, 536 |
| 8 | CH$_2$Cl$_2$ | 383 (47500), 529 (114500) |
|   | neat film | 409, 558, 607 (sh) |
| 9 | CH$_2$Cl$_2$ | 316 (24200), 480 (112800) |
|   | neat film | 340, 486 |
| 10 | CH$_2$Cl$_2$ | 298 (29800), 323 (37500), 560 (142100) |
|   | neat film | 410, 564, 610 (sh) |
| 11 | CH$_2$Cl$_2$ | 381 (50500), 540 (151200) |
|   | neat film | 413, 568, 605 |

EXAMPLE 3

Electrochemical Properties

To probe the electrochemical properties, cyclic voltammetry was carried out in a three-electrode cell with 0.1 M $^n$Bu$_4$NPF$_6$ as the supporting electrolyte in dichloromethane for compounds 1 to 11. The ferrocenium/ferrocene couple (Fc$^+$/Fc) was used as the internal reference.

All boron(III)-containing donor-acceptor compounds show a quasi-reversible couple at −0.74 to −0.93 V vs SCE. This reduction couple is attributed to the reduction at the boron(III) center and is found to be sensitive toward the aromatic backbone. Comparing with compound 1, compounds 7, 8 and 9 show cathodic shift due to the decrease in π-conjugation of the aromatic backbone. It is also noted that more negative potential for the reduction at the boron(III) center is required when B-phenyl group (compound 11) is used instead of B—F (compound 1). Moreover, a second quasi-reversible reduction couple was observed in compounds 2 and 5, which is due to the reduction of the benzothiadiazole and thiazolothiazole moiety, respectively. Furthermore, all compounds show two irreversible oxidation waves, except for compounds 2 and 4 which contain benzothiadiazole and 4,4'-substituted carbozole, that show one reversible oxidation couple and one irreversible oxidation wave. The HOMO levels and the LUMO levels of all the compounds have been determined by using ferrocene as the reference. The LUMO levels of all the compounds are found to be in the range of −3.41 to −3.60 eV, while the HOMO levels of all the compounds are found to range from −5.28 to −5.76 eV. The electrochemical data are summarized in TABLE 2.

TABLE 2

| Compound | Oxidation[a] $E_{1/2}/V^b$ vs SCE $[E_{pa}/V$ vs SCE$]^c$ | Reduction[a] $E_{1/2}/V^b$ vs SCE $[E_{pc}/V$ vs SCE$]^d$ | HOMO[e] [eV] | LUMO[e] [eV] |
|---|---|---|---|---|
| 1 | [+0.94], [+1.58] | −0.79, [−1.58] | −5.28 | −3.55 |
| 2 | +1.05, [+1.54] | −0.80, −1.28 | −5.39 | −3.54 |
| 3 | [+1.18], [+1.27], [+1.53] | −0.74, [−1.50] | −5.46 | −3.60 |
| 4 | +0.89, [+1.58] | −0.81, [−1.62] | −5.23 | −3.53 |
| 5 | [+1.36], [+1.60] | −0.77, −1.26, [−1.59] | −5.69 | −3.57 |
| 6 | [+1.28], [+1.56] | −0.73, [−1.66] | −5.62 | −3.60 |
| 7 | [+1.33], [+1.59] | −0.84, [−1.67] | −5.32 | −3.53 |
| 8 | [+1.12], [+1.52] | −0.84, [−1.64] | −5.36 | −3.47 |
| 9 | [+1.41], [+1.53] | −0.88 | −5.76 | −3.46 |
| 10 | [+1.18], [+1.31], [+1.58] | −0.78, [−1.55] | −5.52 | −3.56 |
| 11 | [+0.98], [+1.52] | −0.93, [−1.63] | −5.32 | −3.41 |

[a]0.1M $^nBu_4NPF_6$ (TBAH) as supporting electrolyte at room temperature; scan rate 200 mV s$^{-1}$.
[b]$E_{1/2} = (E_{pa} + E_{pc})/2$; $E_{pa}$ and $E_{pc}$ are peak anodic and peak cathodic potentials, respectively.
[c]Anodic peak potential for the irreversible oxidation wave.
[d]Cathodic peak potential for the irreversible reduction wave.
[e]The energy level is determined with reference to the HOMO level of ferrocene (−4.8 eV vs. vacuum level).

EXAMPLE 4

Reflectivity Responses of Optical Reflector

An optical reflector according to an embodiment of the invention was constructed in the following manner:
(a) A transparent 3 cm×3 cm quartz plate was ultrasonicated successively with deionized water, analytical grade acetone, analytical grade isopropanol, absolute ethanol for 15 minutes and then dried in an oven at 120° C. for an hour.
(b) A 300 μL CHCl$_3$ solution of compound 1 (5.63 mg/mL) was spin-coated onto the substrate at various spin speeds.

The reflectivity of the optical reflector was measured by Perkin Elmer Lambda 750 UV/Vis/NIR spectrophotometers, equipped with 60 mm integrating sphere. The reflective angle was controlled by the variable angle reflectivity kit. The samples were scanned at a rate of 80 nm min$^{-1}$ with a 2 mm data interval from 1300 to 400 nm, with a detector crossover (PbS to InGaAs) at 860.8 nm.

EXAMPLE 5

Figure 4:
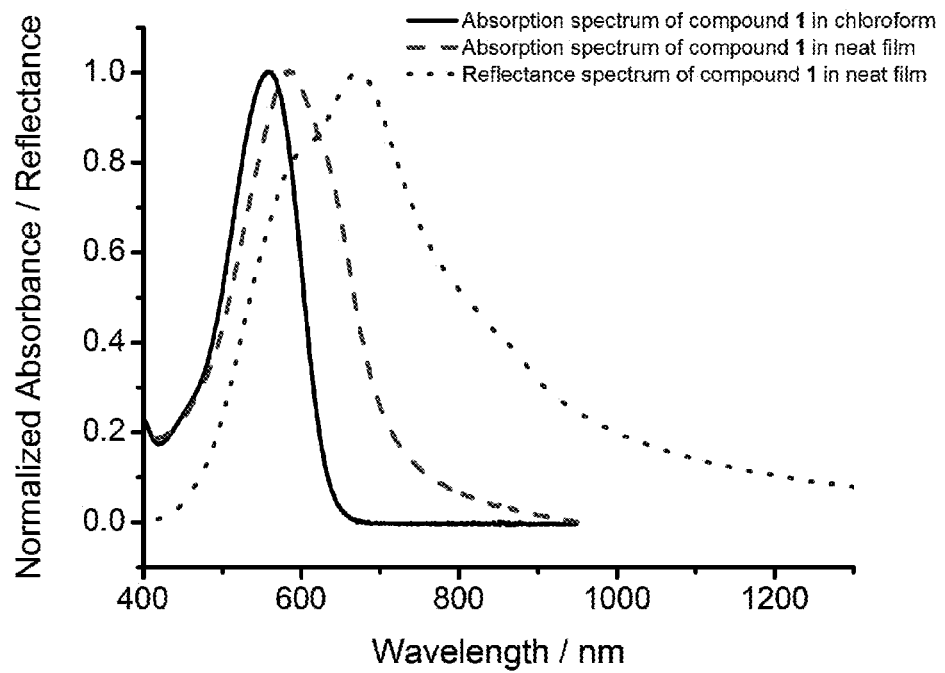
FIG. 4 shows normalized absorption spectra in solution and neat film and the relative reflectance spectra of the neat film of compound 1.

FIG. 1 shows the photo of the thin film coated with compound 1 on quartz plate as optical reflector and the solution of compound 1 in CH$_2$Cl$_2$ viewed from the top and FIG. 2 shows the photo of the thin film coated with compound 1 on quartz plate and the solution of compound 1 in CH$_2$Cl$_2$ viewed from the side. Golden-like metallic luster appearance was observed when viewed from top. Such metallic luster appearance is expected to reflect light. Quantitative reflection measurements were performed on a spectrophotometer equipped with an "integrating" sphere. The normalized reflectivity spectrum was shown in FIG. 4 and compared to the normalized absorption spectra in solution and in thin film. A broad reflective range was observed from 500 to 1200 nm, while the absorption is only up to 900 nm.

EXAMPLE 6

The same materials and processing procedures were employed as described in Example 4, except that spin speeds of 500, 800, 1000, 2000, 3000, 4500 and 6000 were employed.

Figure 5:
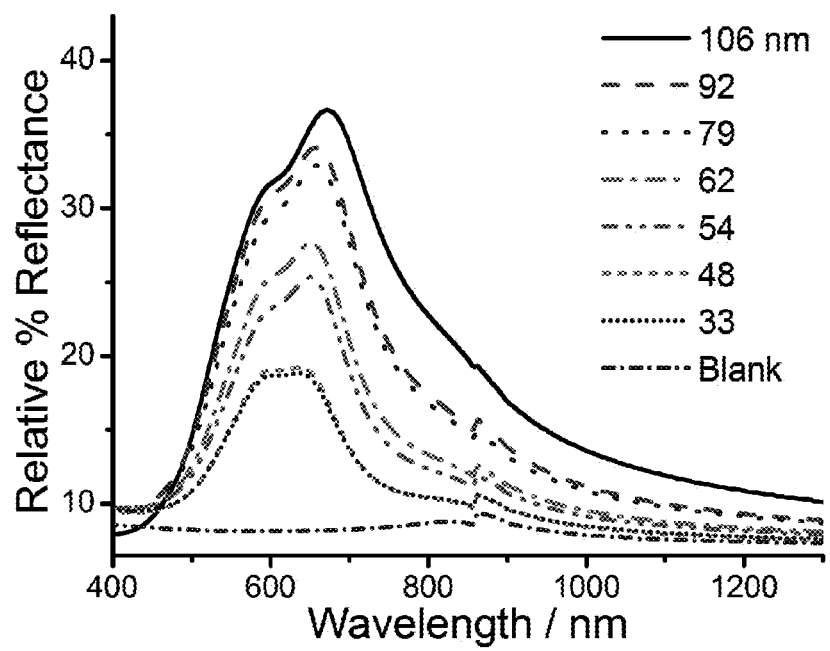
FIG. 5 shows the relative reflectance spectra of the thin film coated with compound 1 on quartz plate at different spin-coating speed.

FIG. 5 shows the relative percentage of reflectivity of compound 1 in 5.63 mg/mL with different spin-coat speeds. The reflectivity was found to be sensitive to the spin-coat speed, in which the spin-coat speed governs the thickness of the film and the film thickness is found to be from 33 to 106 nm. The percentage reflectivity was enhanced from 18 to 37% by increasing the thickness of the film. The range of coverage was also changed. For the optical reflector prepared at 6000 rpm (33 nm), the reflectivity range was found to cover 500 to 750 nm; while for the optical reflector prepared at 500 rpm (106 nm), the reflectivity range was found to span from 500 to 1200 nm.

EXAMPLE 7

The same materials and processing procedures were employed as described in Example 4, except that the a transparent 1 cm×1 cm quartz plate was used. 500 rpm was employed as the spin-coat speed.

Figure 6:
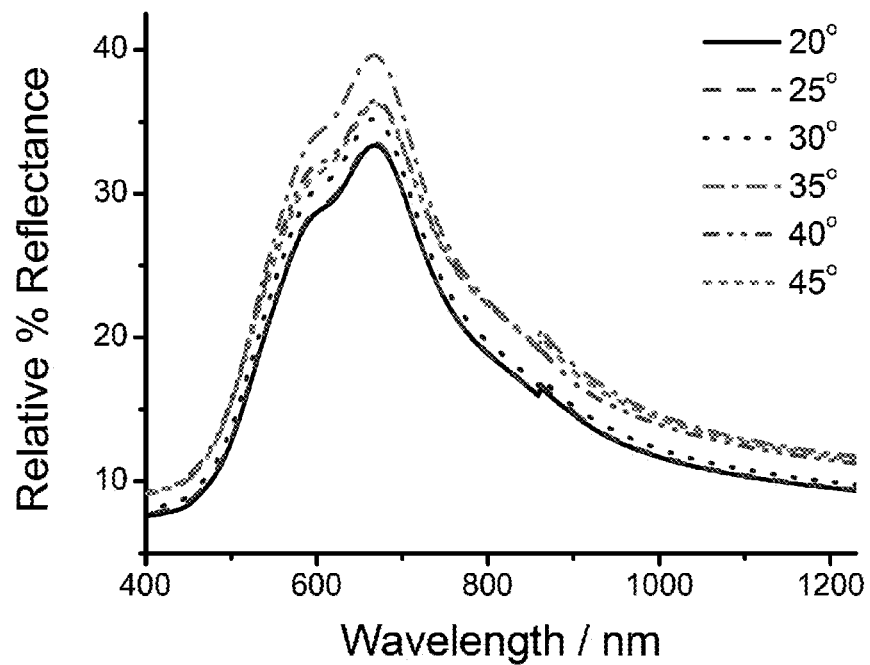
FIG. 6 shows the angle-dependent relative reflectance spectra of the thin film coated with compound 1 on quartz plate.

FIG. 6 shows the angle-dependent reflectance spectra of the thin film of compound 1 from 20° to 45° on quartz plate. Slight increase in the relative % of reflectance with almost no observable change in reflectivity profile was obtained, indicative of the unique reflectivity nature of compound 1 with gold-like reflective behavior.

EXAMPLE 8

The same materials and processing procedures were employed as described in Example 4, except that the a transparent 1 cm×1 cm quartz plate was used. 500 rpm was employed as the spin-coat speed.

Figure 7:
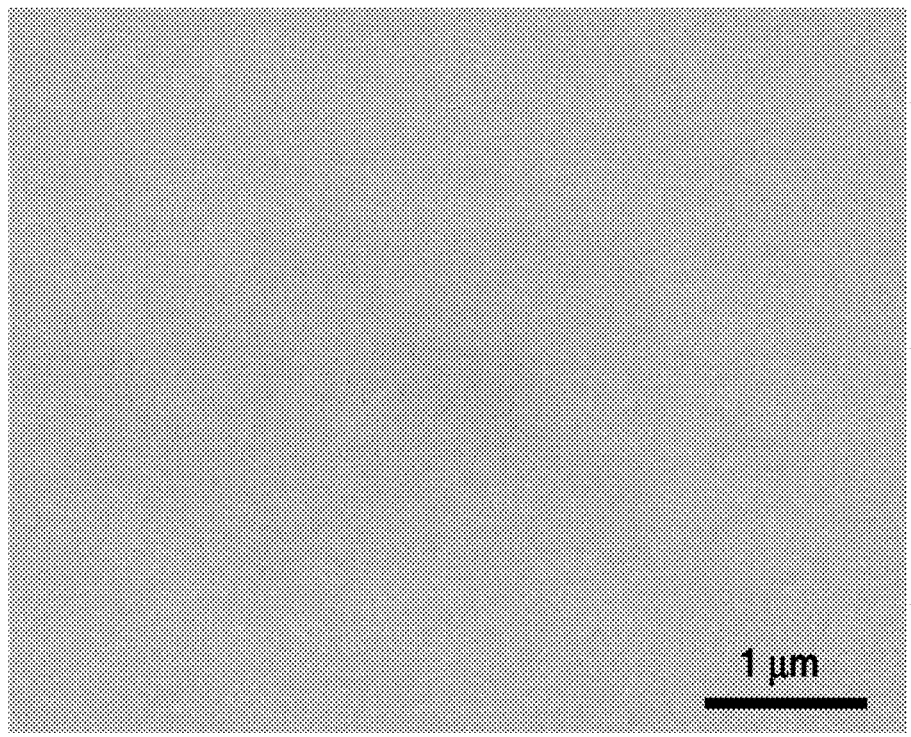
FIG. 7 shows the SEM image of the surface on the thin film coated with compound 1 on quartz plate.
Figure 8:
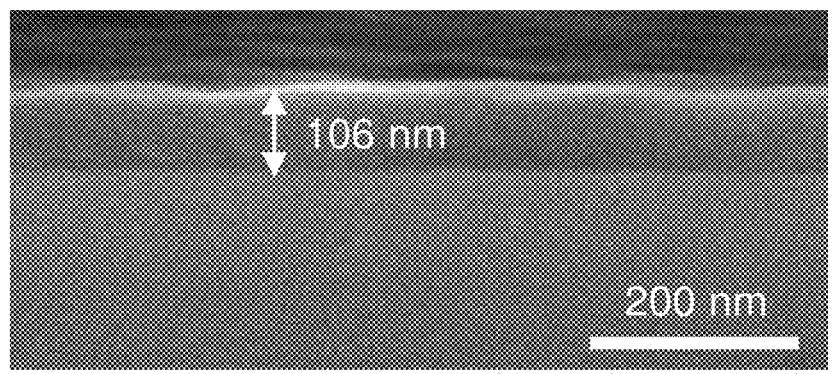
FIG. 8 shows the SEM image of the cross-section of the thin film coated with compound 1 on quartz plate.
Figure 9:
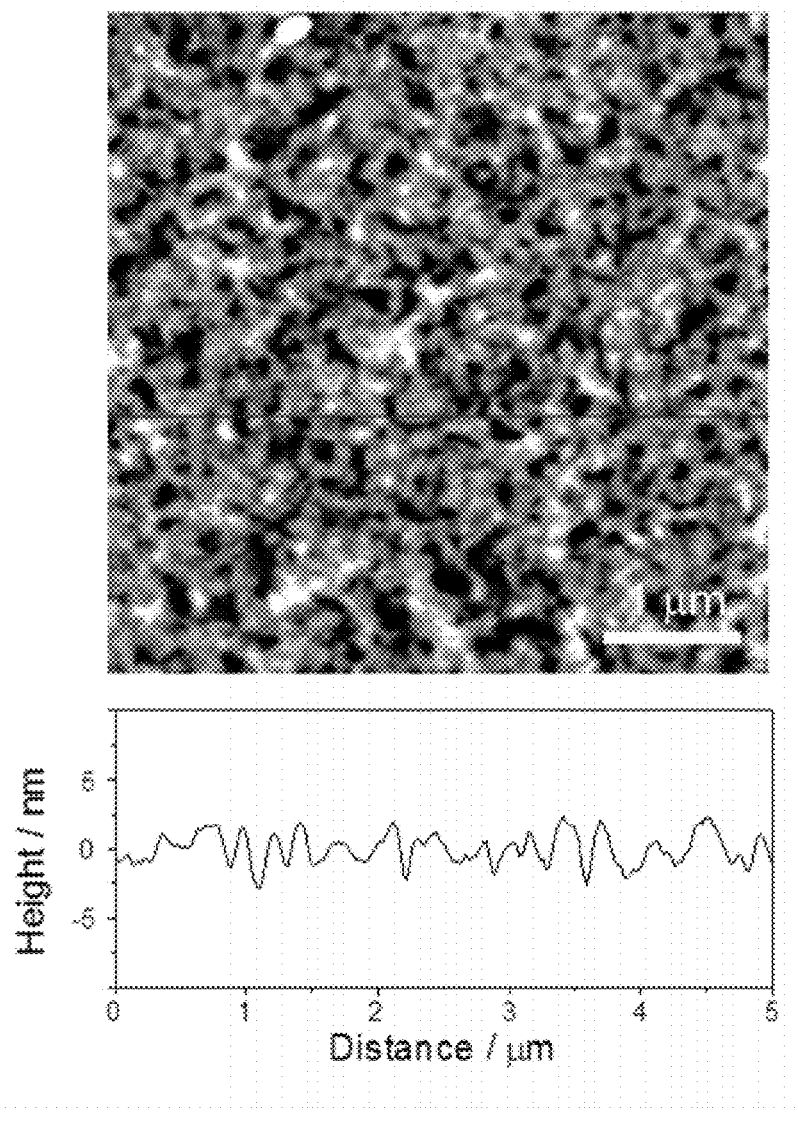
FIG. 9 shows the AFM image of the surface on the thin film coated with compound 1 on quartz plate.

FIG. 7 shows the SEM image of the optical reflector with compound 1. Apparently, no surface morphology was observed from the SEM image, indicating that the film is uniform on the surface. FIG. 8 shows the real-time SEM cross-section of it. The thickness of the optical reflector was found to be 106 nm. The surface roughness of the thin film was also determined by AFM, as depicted in FIG. 9. The surface roughness was found to be ±3.13 nm.

EXAMPLE 9

The same materials and processing procedures were employed as described in Example 4, except that compounds 2-11 were used as the active layer in the optical reflector.

Figure 10:
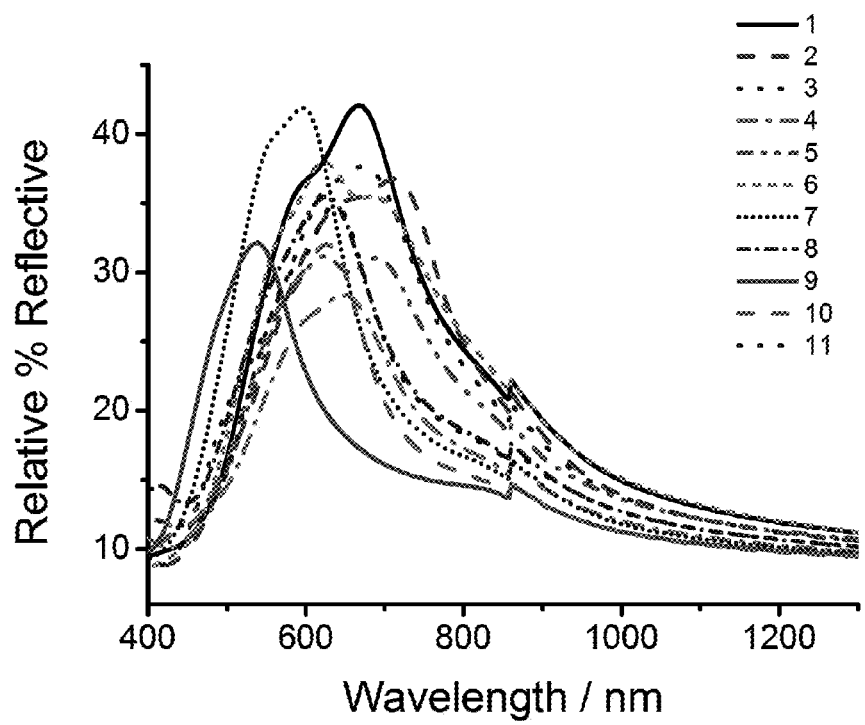
FIG. 10 shows the relative reflectance spectra of the thin film coated with compound 1-11 on quartz plate.

FIG. 10 shows the relative percentage of reflectivity of compounds 1-11. The percentage reflectivity of all preferred compounds for invention covered almost the entire visible to near-infrared region from 400-1300 nm, with the peak maxima of the reflectivity ranging from 28 to 43%. TABLE 3 summarizes the reflectivity responses of the as-prepared optical reflectors with compounds 1-11. These results demonstrate that the boron(III)-containing donor-acceptor compounds are promising candidates in the preparation of solution-processable optical reflectors.

TABLE 3

| Compound | Reflectance $\lambda_{max}$ [nm] (percentage of reflectivity) | Reflectivity range [nm] [above 10% reflectivity] |
| --- | --- | --- |
| 1 | 596 (sh), 668 (43%) | 450-1300 |
| 2 | 645 (sh), 714 (37%) | 450-1300 |
| 3 | 626 (sh), 672 (38%) | 440-1300 |
| 4 | 602 (sh), 650 (28%) | 432-1240 |
| 5 | 622 (31%), 692 (31%) | 400-1300 |
| 6 | 622 (38%), 688 (36%) | 442-1300 |
| 7 | 558 (sh), 596 (42%) | 400-1000 |
| 8 | 626 (36%) | 400-1100 |
| 9 | 540 (32%) | 400-1000 |
| 10 | 576 (sh), 626 (32%) | 400-1120 |
| 11 | 582 (sh), 636 (35%) | 400-1300 |

These examples should not be construed as limiting the scope of the invention, but as providing illustrations of some of the embodiments of the invention. It is being understood that changes and variations can be made therein without deviating from the scope and the spirit of the invention as herein after claimed.

EXAMPLE 10

Memory Responses of Memory Devices

A memory device according to an embodiment of the invention was constructed in the following manner
(a) A transparent anode indium-tin-oxide (ITO)-coated borosilicate glass substrate (2 cm×2 cm) was ultrasonicated successively with deionized water having a resistivity of 18.2 mega-ohm, analytical grade acetone, analytical grade isopropanol, absolute ethanol for 15 minutes and then dried in an oven at 120 degree C. for an hour.
(b) A 300 µL CHCl$_3$ solution of compound 1 was spin-coated onto the ITO substrate in a 2-step spinning mode, 500 rpm for 9 seconds followed by 2000 rpm for 30 seconds;
(c) The substrate was placed in oven at 60° C. for 2 hours to remove the solvent residue;
(d) The substrate was put into a vacuum chamber, and the chamber was pumped down from 1 bar to 5×10$^{-6}$ mbar;
(e) Aluminum (Al) layer was deposited by thermal evaporation to form a cathode.

Current-voltage (I-V) characteristics of the memory devices were measured with a programmable Keithley model 4200 power source in a four-probe station. 400 devices were fabricated on each ITO glass platform and the active area of each cell is 0.25 mm$^2$.

EXAMPLE 11

Figure 11:
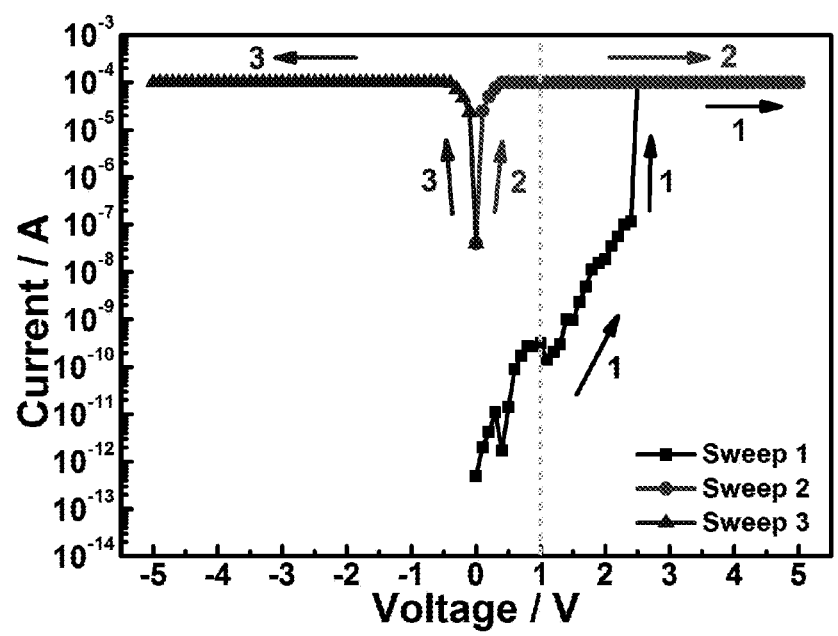
FIG. 11 shows the I-V characteristics of an ITO/active layer/Al device of compound 1.
Figure 12:
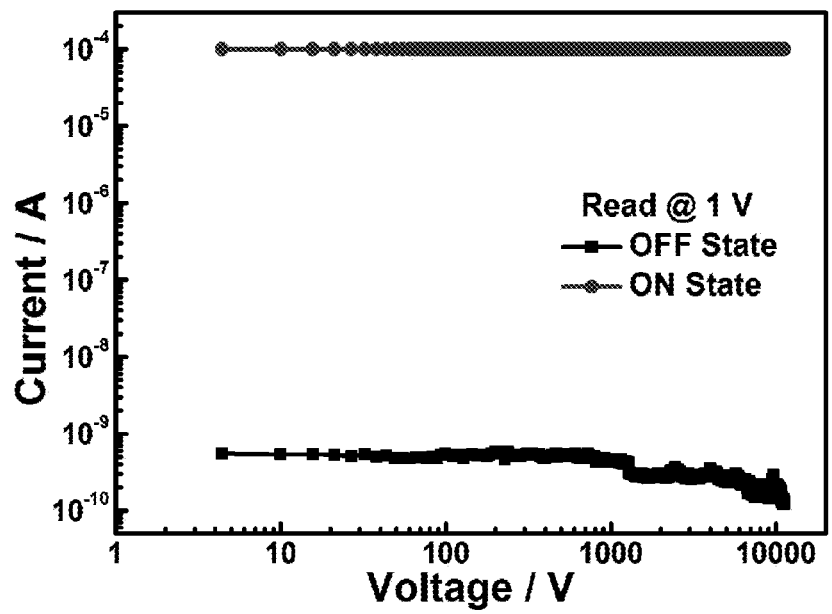
FIG. 12 shows the stability of the ITO/active layer/Al device of compound 1 in "0" and "1" states under a constant stress (1.0 V).
Figure 13:
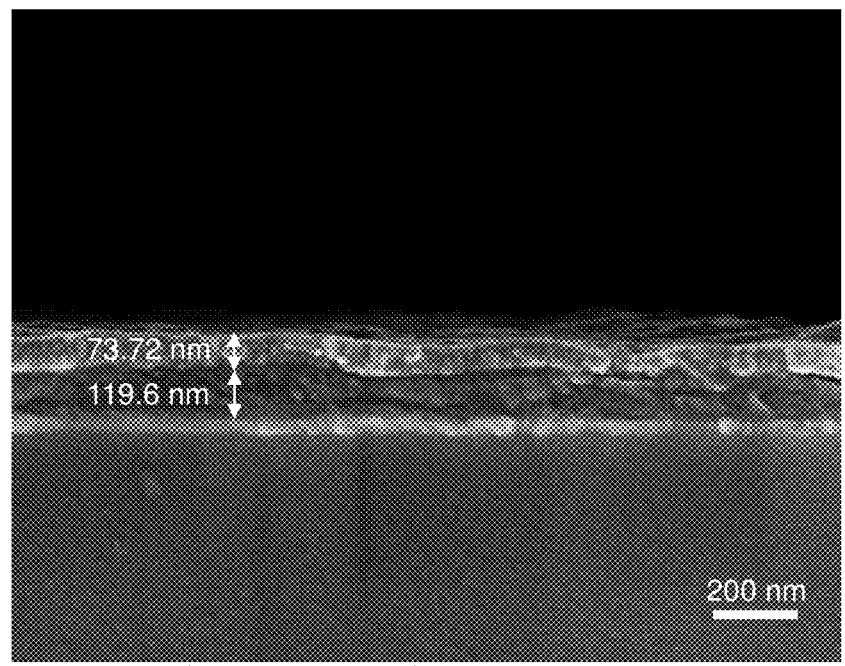
FIG. 13 shows the SEM image of the cross-section of the device of compound 1.

The memory effect of compound 1 is shown by the current-voltage (I-V) characteristics in FIG. 11. The devise was swept positively, with the sweep direction indicated by the arrows. Initially, the device was at its low-conductivity state, denoted as OFF state. The current density in this state is quite low (10$^{-9}$ Acm$^{-2}$). When a switching threshold voltage of about 2.4 V was applied, an abrupt increase in current was observed, indicating the transition from low-conductivity state to high-conductivity state, denoted as ON state (sweep 1). The device remains in the ON state when the voltage sweep was repeated (sweep 2), indicating that the ON state is retained and memory effect is obtained. The memory device cannot be returned to the OFF state by the application of a reverse bias of the same magnitude that it has been switched ON (sweep 3). The stability of the device under a constant stress of 1 V is shown in FIG. 12. No significant degradation is observed in current for ON and OFF states for at least 10000 seconds during the measurement, suggesting that the device exhibits a precise control of the ON and OFF state with low misreading rate. The film thickness of compound 1 and aluminum was found to be about 120 nm and 74 nm, respectively, by using SEM through a cross section of the device, as shown in FIG. 13.

EXAMPLE 12

The same materials and processing procedures were employed as described in Example 10, except that compound 2 was used as the active layer.

Figure 14:
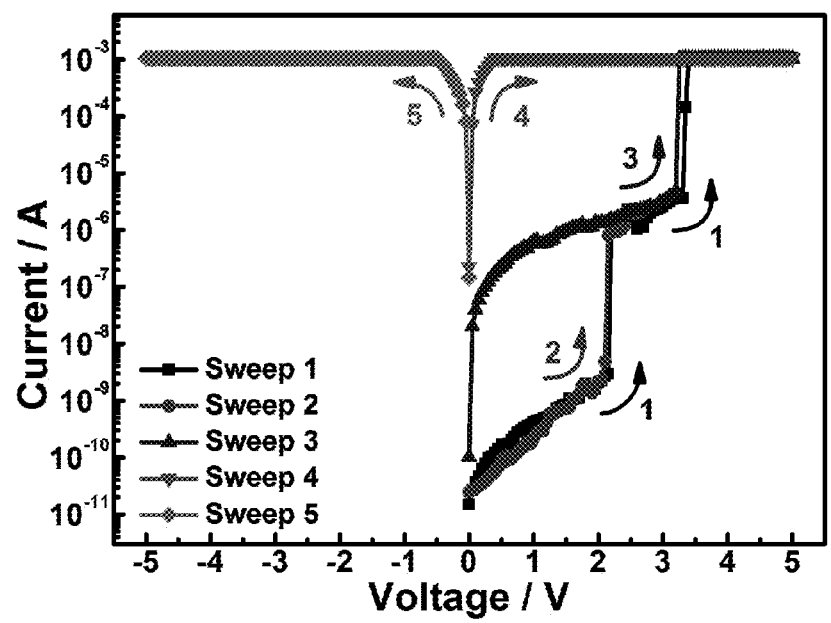
FIG. 14 shows the I-V characteristics of an ITO/active layer/Al device of compound 2.
Figure 15:
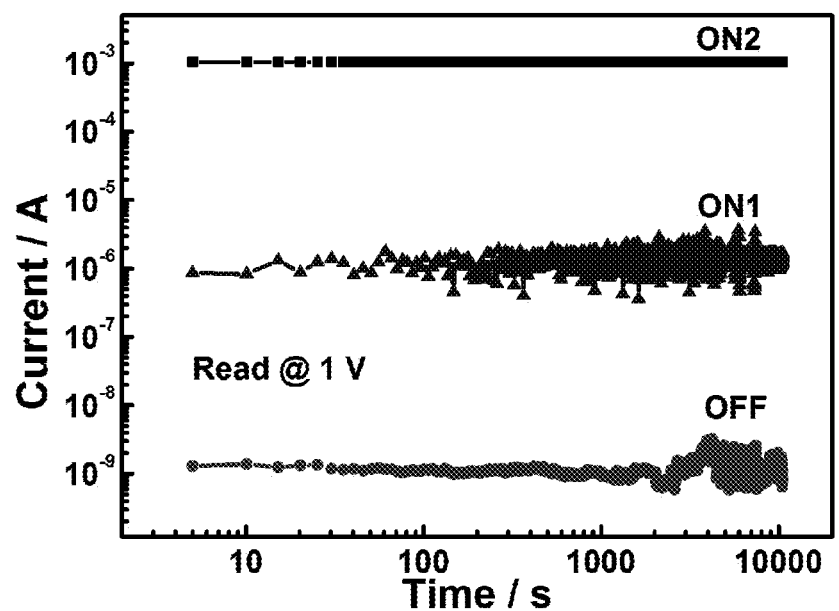
FIG. 15 shows the stability of the ITO/active layer/Al device of compound 2 in "0", "1" and "2" states under a constant stress (1.0 V for "0" state, "1" and "2" states).
Figure 16:
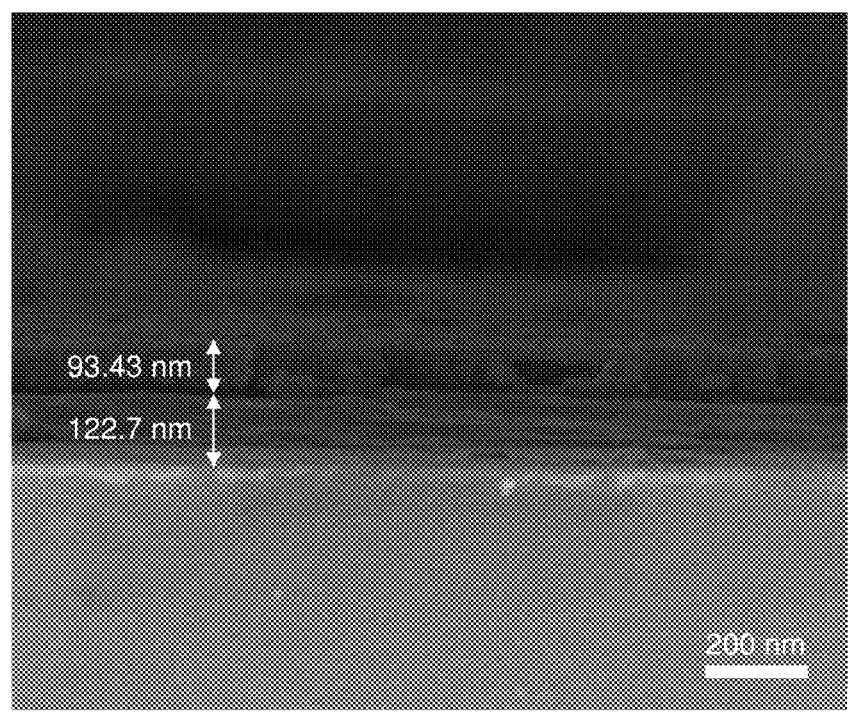
FIG. 16 shows the SEM image of the cross-section of the device of compound 2.

FIG. 14 shows the I-V performances of the as-fabricated device of Al/compound 2/ITO. The first sweep of the as-fabricated device exhibited two abrupt increases in the current at the switching threshold voltages, namely 2.0 V and 3.3 V, respectively. This process demonstrates the transition from a low-conductivity state, denoted as "0" state, to an intermediate-conductivity state, denoted as "1" state, and finally to a high-conductivity state, denoted as "2" state. The three states exhibited a distinct current ratio of 1:10$^3$:10$^6$ for "0", "1" and "2" states, suggestive of a ternary memory device. The stability of the device under a constant stress is shown in FIG. 15. No significant degradation is observed in current for "0", "1" and "2" states for at least 10000 seconds during the measurement, suggesting that the device exhibit a precise control of the three independent states with low misreading rate. The film thickness of compound 2 and aluminum was found to be about 123 nm and 93 nm, respectively, by using SEM through a cross section of the device, as shown in FIG. 16.

These examples should not be construed as limiting the scope of the invention, but as providing illustrations of some of the embodiments of the invention. It is being understood that changes and variations can be made therein without deviating from the scope and the spirit of the invention as hereinafter claimed.

With respect to any figure or numerical range for a given characteristic, a figure or a parameter from one range may be combined with another figure or a parameter from a different range for the same characteristic to generate a numerical range.

Other than in the operating examples, or where otherwise indicated, all numbers, values and/or expressions referring to quantities of ingredients, reaction conditions, etc., used in the specification and claims are to be understood as modified in all instances by the term "about."

While the invention has been explained in relation to certain embodiments, it is to be understood that various modifications thereof will become apparent to those skilled in the art upon reading the specification. Therefore, it is to be understood that the invention disclosed herein is intended to cover such modifications as fall within the scope of the appended claims.

What is claimed is:

1. An optical reflector comprising in sequence, an active layer, and a flat substrate, wherein the active layer is formed by spin-coating a boron(III)-containing donor-acceptor compound, the boron(III)-containing donor-acceptor compound is represented by the structure:

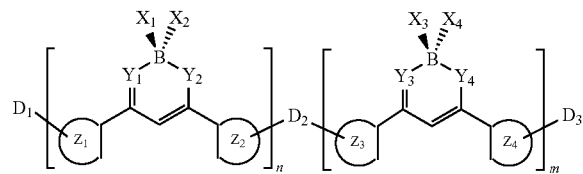

wherein
a) B is a boron atom;
b) each boron atom attaches one or two of the $X_1$, $X_2$, $X_3$ and $X_4$ and two of the $Y_1$, $Y_2$, $Y_3$, and $Y_4$;
c) $X_1$, $X_2$, $X_3$ and $X_4$ are independently C, F, Cl, Br, I, S, N, O, P, Ge, Se, Te, an oxidized form of S, an oxidized form of P, an oxidized form of Se or an oxidized form of Te, wherein $X_1$, $X_2$, $X_3$ and $X_4$ are independently substituted with an alkyl, substituted alkyl, heteroaryl or substituted heteroaryl;
d) $Y_1$, $Y_2$, $Y_3$, and $Y_4$ are independently a heteroatom, where the heteroatom can either be O, S, Se, Ge, Te, PR, or NR, and R is a substituent on specific heteroatom or carbon atom which can be selected from alkyl or aromatic groups;
e) $Z_1$, $Z_2$, $Z_3$, and $Z_4$ are cyclic structure derivatives;
f) $D_1$, $D_2$ and $D_3$ are optionally alkyl substituted aromatic group; and
g) n and m are any integer greater than 0.

2. The optical reflector according to claim 1 in which $X_1$ and $X_2$ of the boron(III)-containing donor-acceptor compound is F, Cl, Br, I, S, N, O, P, Ge, Se, Te, an oxidized form of S, an oxidized form of P, an oxidized form of Se or an oxidized form of Te.

3. The optical reflector according to claim 1 in which $X_1$ and $X_2$ of the said boron(III)-containing donor-acceptor compound is C.

4. The optical reflector according to claim 1 in which $Y_1$ and $Y_2$ of the boron(III)-containing donor-acceptor compound comprises a carbon atom.

5. The optical reflector according to claim 1 in which the heteroatom of $X_1$, $X_2$, $X_3$ and $X_4$ comprises one or more of fluorine, chorine, bromine, iodine, sulfur, nitrogen, oxygen, phosphorus, germanium, selenium, or tellurium.

6. The optical reflector according to claim 1 in which $D_1$, $D_2$ and $D_3$ are the optionally substituted alkyl or aromatic group attached to the boron(III) backbone which can be independently selected from alkylamino, arylamine, thiophene, oligo-thiophenes, fused-thiophenes fluorine, dibenzothiophene, dibenzofuran, dibenzophosphole, benzothiadiazole, thiazolothiazole, benzodithiophene, and derivatives thereof.

7. The optical reflector according to claim 1 in which $Z_1$ and $Z_2$ are independently selected from a 5- or 6-membered arene, heteroarene or heterocycle derivatives.

8. The optical reflector according to claim 1 in which $Z_1$ and $Z_2$ are independently selected from benzene, pyridine, thiophene, furan, fused-thiophene, pyrazole, pyrimidine, pyrrole, selenophene, tellurophene, benzimidazole, benzofuran, benzothiazole, benzoxazole, benzophosphole, indole, indane, naphthalene, anthracene, pyrene, thiazole, pyran, thiapyran, carbazole, dibenzothiophene, dibenzofuran, dibenzosilole, fluorene, dibenzophosphole, and derivatives thereof.

9. An optical reflector comprising in sequence, an active layer, and a flat substrate, wherein the active layer is formed by spin-coating a boron(III)-containing donor-acceptor compound, the boron(III)-containing donor-acceptor compound is represented by at least one of the structures (1)-(11):

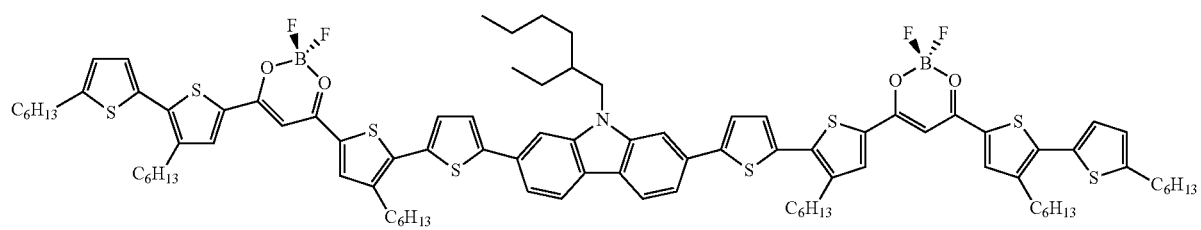

(1)

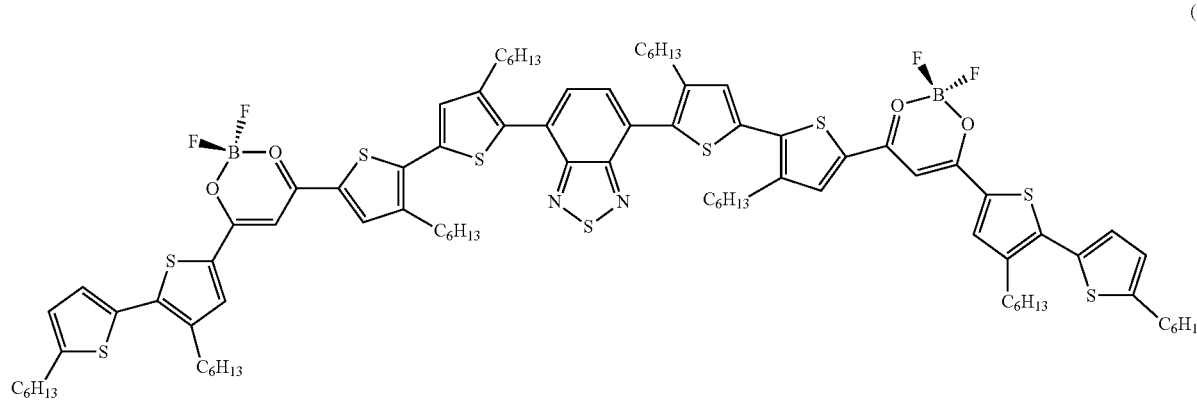

(2)

-continued
(3)
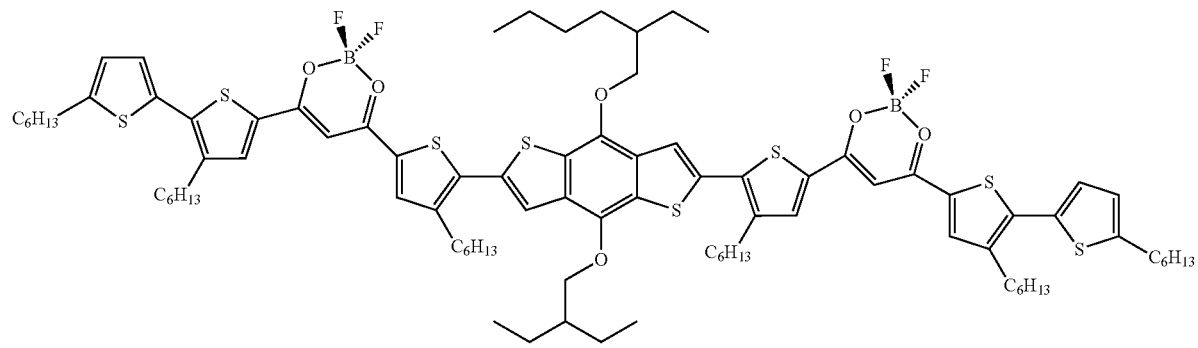
(4)
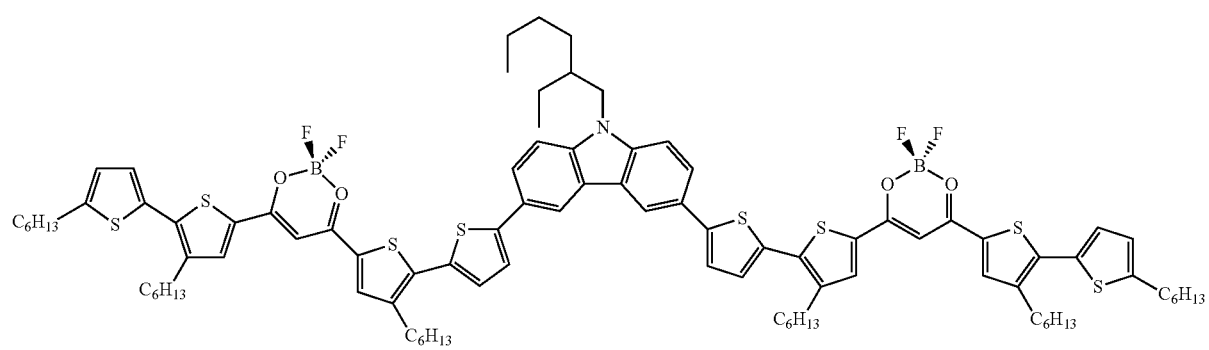
(5)
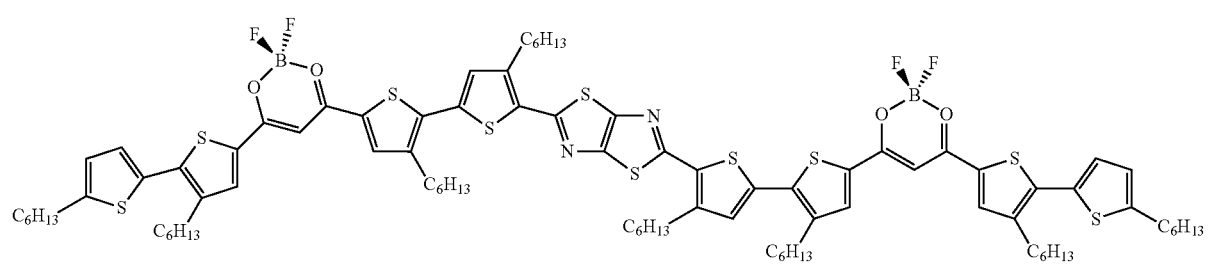
(6)
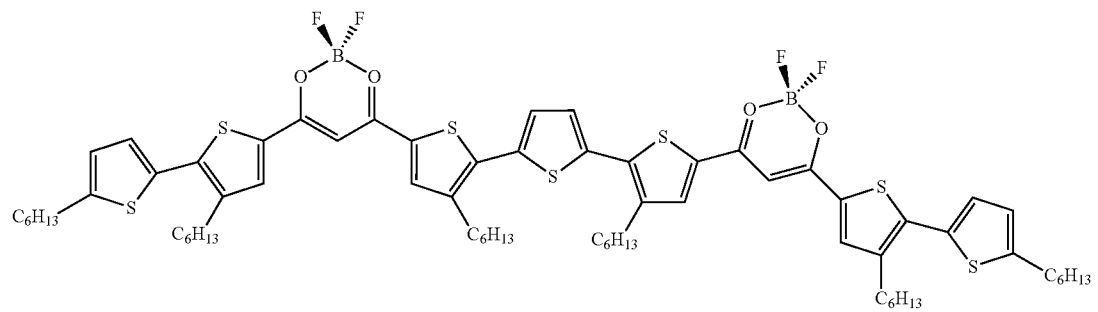
(7)
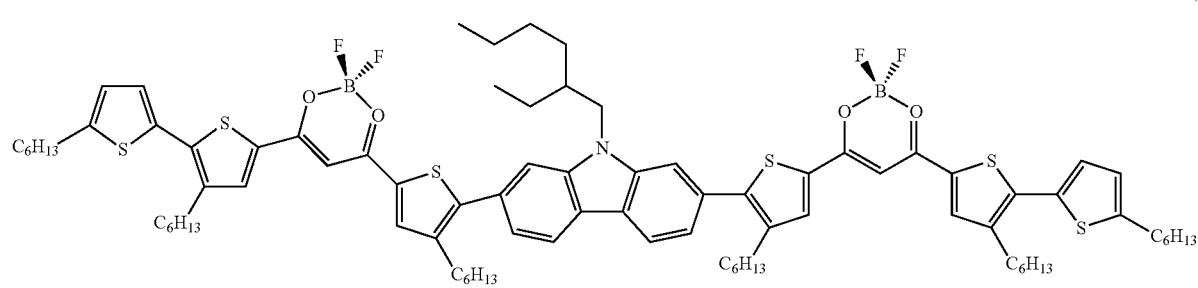

(8)

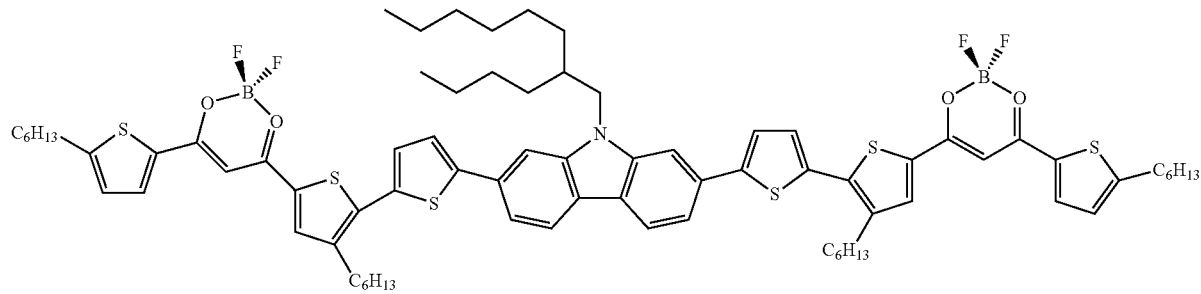

(9)

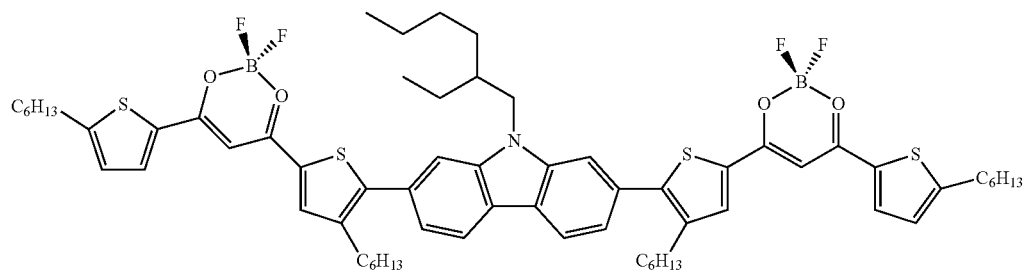

(10)

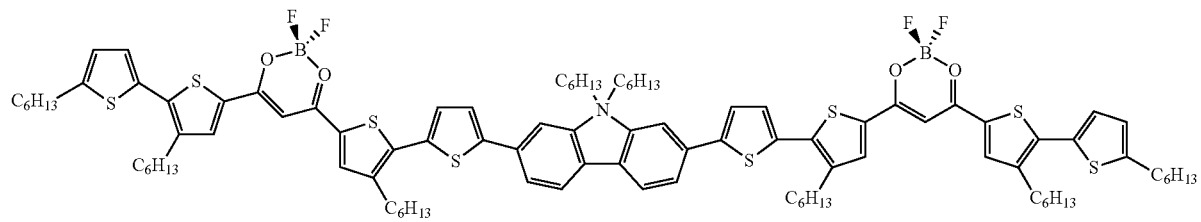

(11)

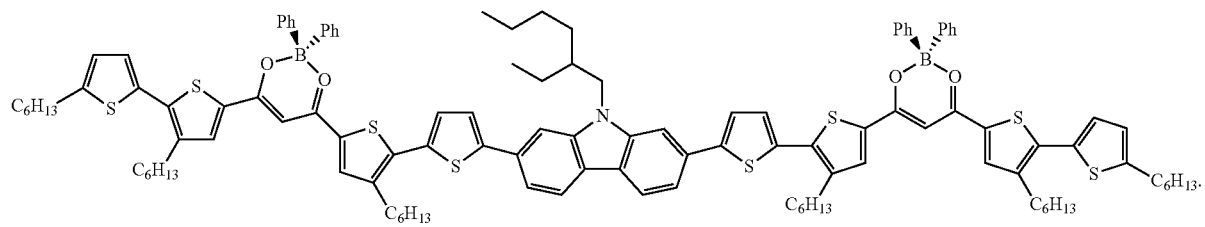

10. An organic memory device comprising in sequence, an anode, an active layer, and a cathode, wherein the active layer is formed by spin-coating a boron(III)-containing donor-acceptor compound, the boron(III)-containing donor-acceptor compound is represented by the structure:

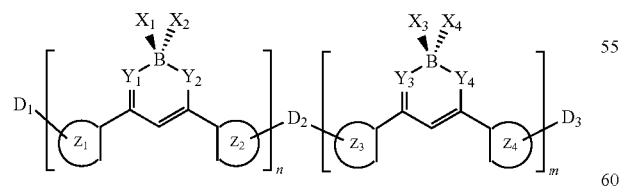

wherein
a) B is a boron atom;
b) each boron atom attaches one or two of the $X_1$, $X_2$, $X_3$ and $X_4$ and two of the $Y_1$, $Y_2$, $Y_3$, and $Y_4$;
c) $X_1$, $X_2$, $X_3$ and $X_4$ are independently C, F, Cl, Br, I, S, N, O, P, Ge, Se, Te, an oxidized form of S, an oxidized form of P, an oxidized form of Se or an oxidized form of Te, wherein $X_1$, $X_2$, $X_3$ and $X_4$ are independently substituted with an alkyl, substituted alkyl, heteroaryl or substituted heteroaryl;
d) $Y_1$, $Y_2$, $Y_3$, and $Y_4$ are independently a heteroatom, where the heteroatom can either be O, S, Se, Ge, Te, PR, or NR, and R is a substituent on specific heteroatom or carbon atom which can be selected from alkyl or aromatic groups;
e) $Z_1$, $Z_2$, $Z_3$, and $Z_4$ are cyclic structure derivatives;
f) $D_1$, $D_2$ and $D_3$ are optionally alkyl substituted aromatic group; and
g) n and m are any integer greater than 0.

11. The organic memory device according to claim 10 in which $Z_1$ and $Z_2$ are independently selected from benzene, pyridine, thiophene, furan, fused-thiophene, pyrazole, pyrimidine, pyrrole, selenophene, tellurophene, benzimidazole, benzofuran, benzothiazole, benzoxazole, benzophosphole, indole, indane, naphthalene, anthracene, pyrene, thiazole, pyran, thiapyran, carbazole, dibenzothiophene, dibenzofuran, dibenzosilole, fluorene, dibenzophosphole, and derivatives thereof.

12. An organic memory device comprising in sequence, an anode, an active layer, and a cathode, wherein the active layer is formed by spin-coating a boron(III)-containing donor-acceptor compound, the boron(III)-containing donor-acceptor compound is represented by at least one of the structures (1)-(11):

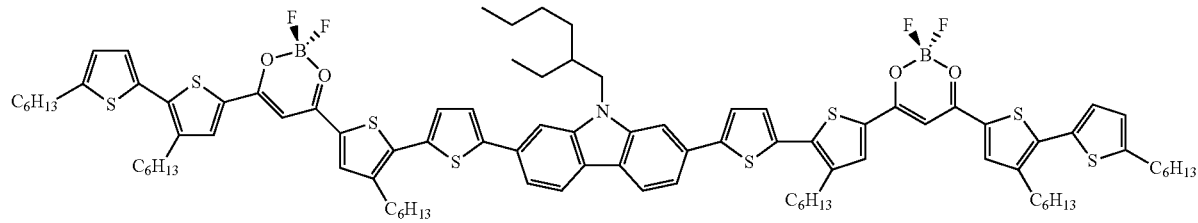
(1)

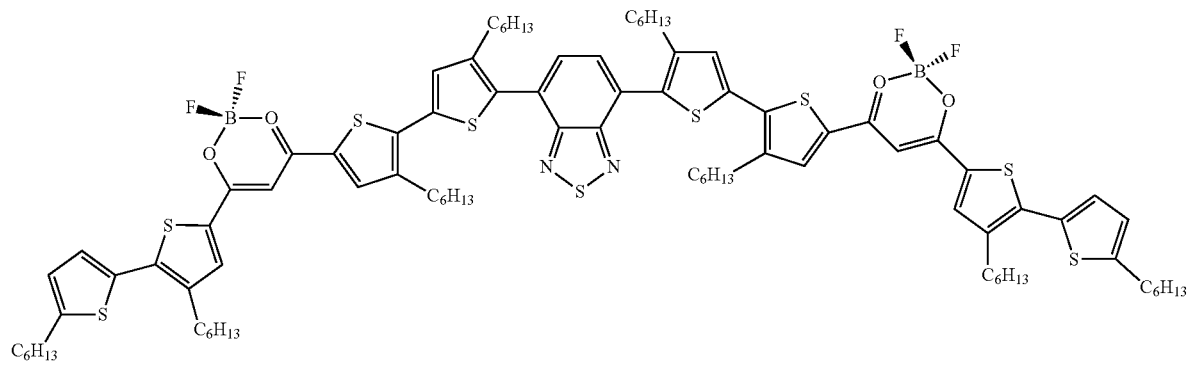
(2)

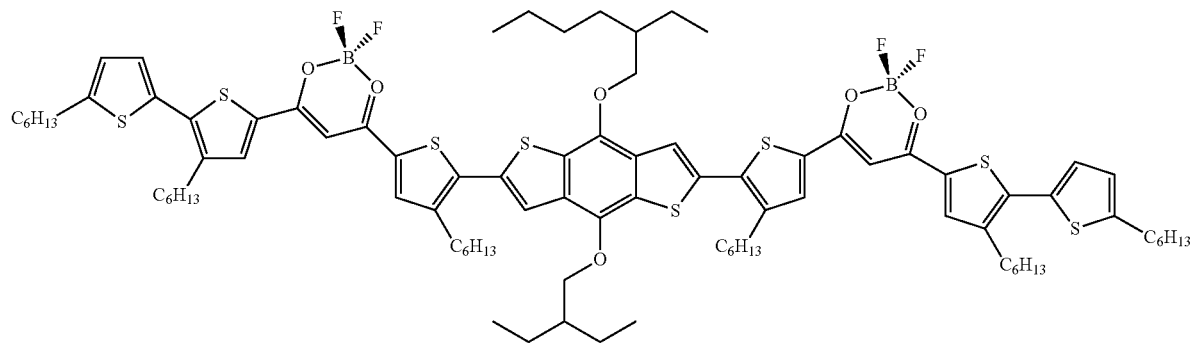
(3)

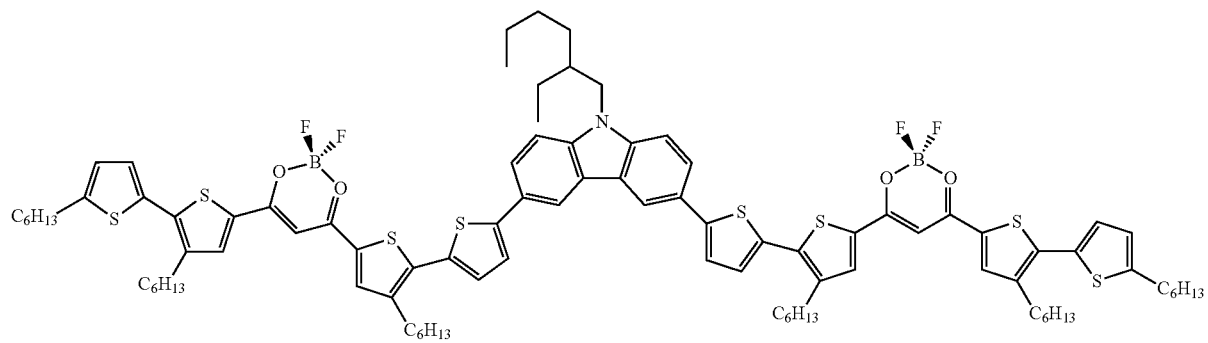
(4)

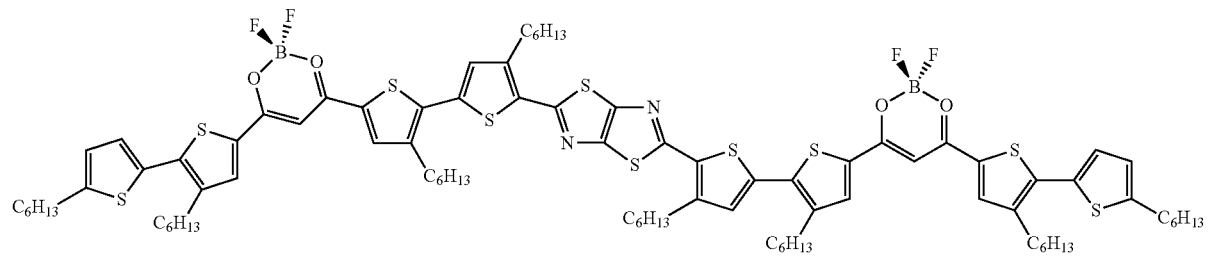
(5)
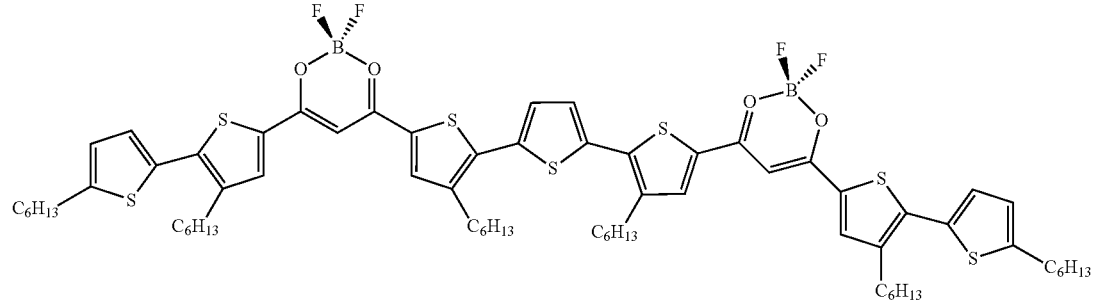
(6)
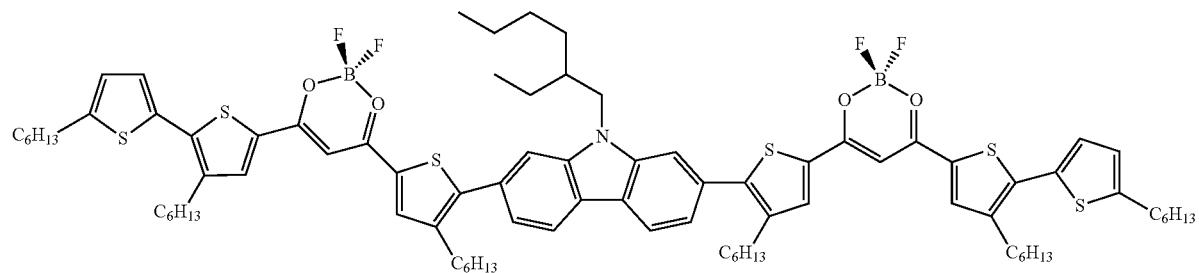
(7)
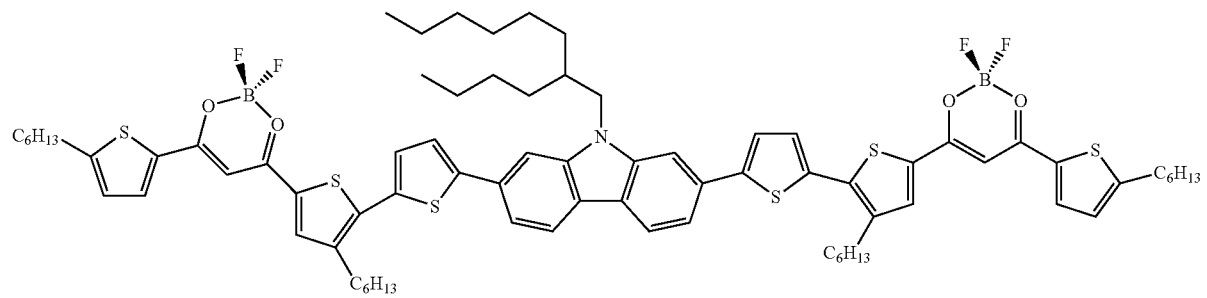
(8)
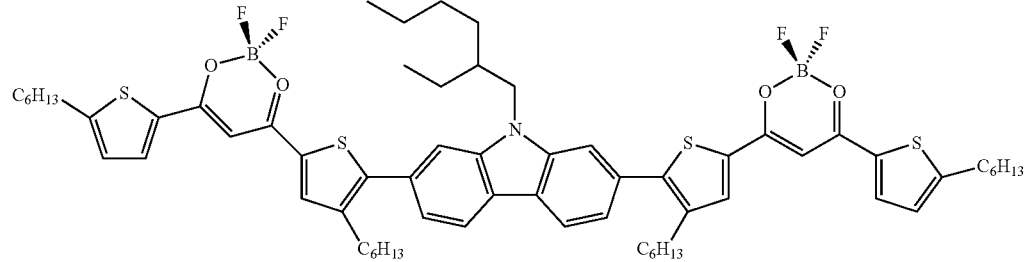
(9)

(10)
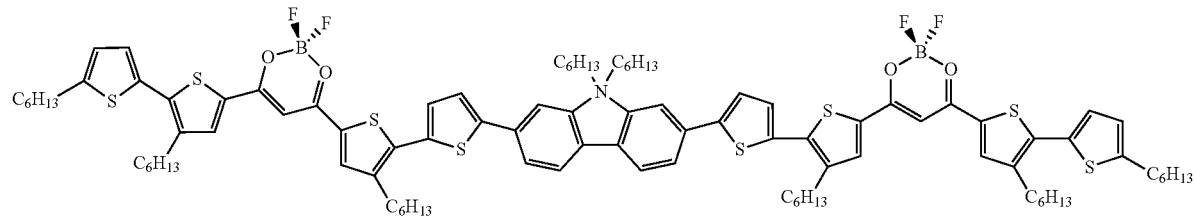
(11)
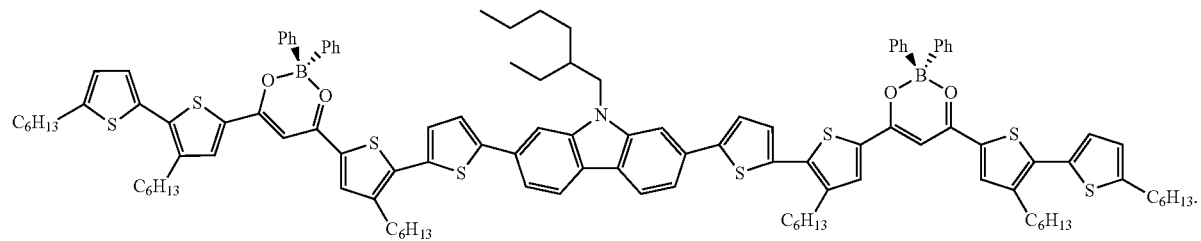
* * * * *